United States Patent [19]

Israelsen

[11] Patent Number: 5,247,357
[45] Date of Patent: Sep. 21, 1993

[54] IMAGE COMPRESSION METHOD AND APPARATUS EMPLOYING DISTORTION ADAPTIVE TREE SEARCH VECTOR QUANTIZATION WITH AVOIDANCE OF TRANSMISSION OF REDUNDANT IMAGE DATA

[75] Inventor: Paul D. Israelsen, North Logan, Utah

[73] Assignee: Scientific Atlanta, Inc., Atlanta, Ga.

[21] Appl. No.: 794,589

[22] Filed: Nov. 19, 1991

Related U.S. Application Data

[63] Continuation-in-part of Ser. No. 359,496, May 31, 1989, Pat. No. 5,124,791.

[51] Int. Cl.$^5$ .............................................. H04N 7/12
[52] U.S. Cl. .................................. 358/133; 341/106; 358/135
[58] Field of Search ....................... 358/133, 135, 136; 375/122; 381/31, 32; 341/106

[56] References Cited

U.S. PATENT DOCUMENTS

| | | | |
|---|---|---|---|
| 4,558,350 | 12/1985 | Murakami | 358/21 |
| 4,560,977 | 12/1985 | Murakami et al. | 340/347 |
| 4,878,230 | 10/1989 | Murakami et al. | 375/27 |
| 4,951,139 | 8/1990 | Hamilton et al. | 358/135 |
| 4,954,892 | 9/1990 | Asai et al. | 358/133 |
| 4,979,039 | 12/1990 | Kisor et al. | 358/133 |
| 5,008,747 | 4/1991 | Carr et al. | 358/136 |
| 5,010,401 | 4/1991 | Murakami et al. | 358/133 X |
| 5,021,971 | 6/1991 | Lindsay | 358/133 X |
| 5,067,152 | 11/1991 | Kisor et al. | 358/133 X |
| 5,068,723 | 11/1991 | Dixit et al. | 358/133 |

OTHER PUBLICATIONS

"Vector Quantization of Digital Images", Baker, Richard L., Stanford University—University Microfilms International, UMI Dissertation Information Service, (Copyright, 1984).

"Vector Quantization", Gray, Robert M., The Institute of Electrical and Electronics Engineers, Inc., ASSP Mag., vol. 1, pp. 4–29, Apr. 1984.
"Variable Rate Vector Quantization of Images", Riskin, Eve A., Dissertation submitted to the Dept. of Electrical Engineering—Stanford University, May, 1990.
"Interpolative Vector Quantization of Color Images", Hang, Hsueh-Ming and Haskell, Barry G., IEEE Transactions on Communications, vol. 36, No. 4, Apr. 1988.
U.S. patent application Ser. No. 365,940 entitled "Method and Apparatus For Data Compression with Reduced Distortion" Filed: Jun. 13, 1989.
U.S. patent application Ser. No. 359,496 entitled "Frame-to-Frame Compression on Vector Quantized Signals and Other Post-Processing", Filed: May 31, 1989.
"Image Compression Using Adaptive Vector Quantization", Goldberg, M. et al., IEEE Trans. Commun., vol. COM-34, pp. 180–187, Feb. 1986.

(List continued on next page.)

Primary Examiner—Victor R. Kostak
Attorney, Agent, or Firm—Woodcock Washburn Kurtz Mackiewicz & Norris

[57] ABSTRACT

A variable rate vector quantization apparatus and method employs a tree structured codebook. Code vectors are selected from different levels of the codebook according to the value of a threshold. The value of the threshold is periodically adjusted according to the fullness of a buffer that stores vector quantized data to be transmitted. According to the invention, vector quantized data for redundant, or similar, vectors is not transmitted. Rather, a "copy last vector" instruction is transmitted for these vectors to achieve further data compression. A method of mean removal from vectors to be vector quantized is also disclosed.

54 Claims, 19 Drawing Sheets

OTHER PUBLICATIONS

"A Finite State/Frame Difference Interpolative Vector Quantizer for Low Rate Image Sequence Coding", Shen, Hsiao-hui, et al., Proc. IEEE Int. Conf. Acoust., Speech, Signal Processing, vol. 2, pp. 1188-1191, Apr. (1988).

"Variable-Rate Multi-Stage Vector Quantization for Image Coding", Ho, Yo Sung et al., Dept. of Electrical and Computer Eng., Univ. of California, pp. 1156-1159.

"Pruned Tree-Structured Vector Quantization in Image Coding", Riskin, Eve A., et al., Information Systems Lab., Stanford University—Stanford, California.

"Image Compression Methods With Distortion Controlled Capabilities", Markas, Tassos et al., Depts. of Elec. Eng. and Computer Science, Duke Univ., Durham, NC.

"A Video Encoding System With Conditional Picture-Element Replenishment", Mounts, F. W., The Bell System Technical Journal, Sep. 1989, pp. 2545-2554.

"Variable Rate Vector Quantization for Medical Image Compression", Riskin, Eve A., Lookabaugh, T. et al., IEEE Trans. on Medical Imaging, vol. 9, No. 3, Sep. 1990.

FIG. 6
| CODEVECTOR | ADDRESS |
|---|---|
| $CV_1$ | $A_1$ |
| $CV_2$ | $A_2$ |
| $CV_3$ | $A_3$ |
| ⋮ | ⋮ |
| $CV_{64}$ | $A_{64}$ |
M
FIG. 9
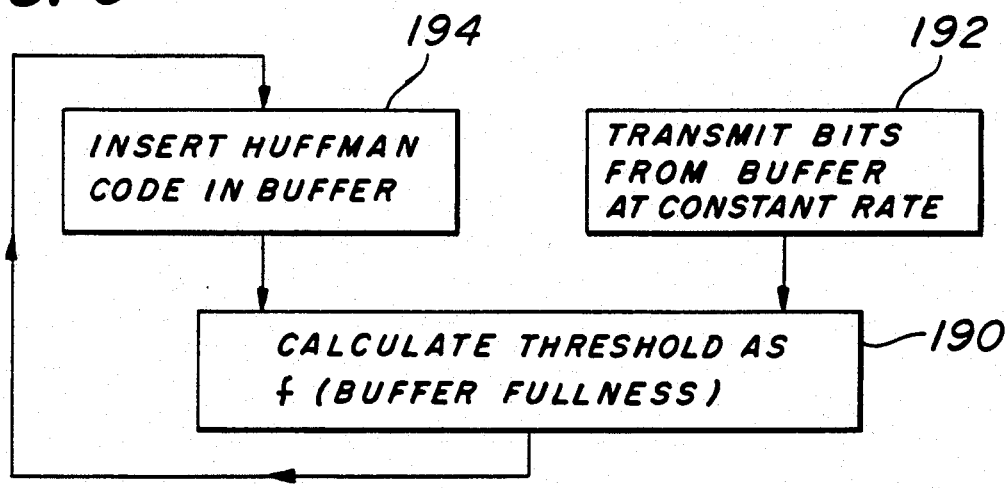
FIG. 10
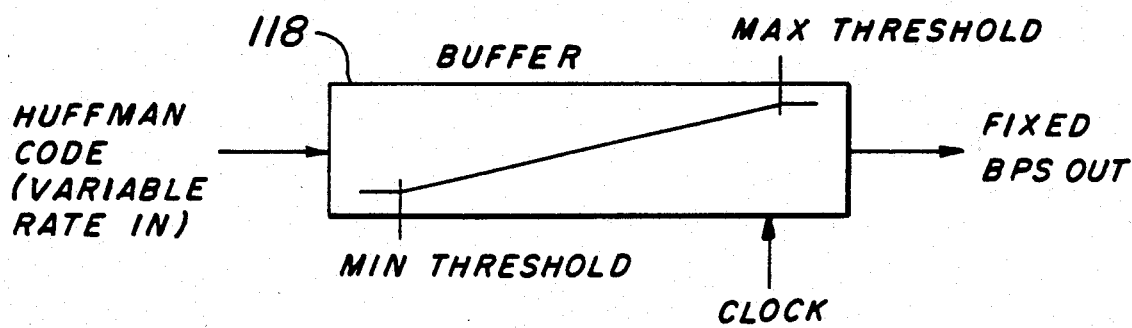

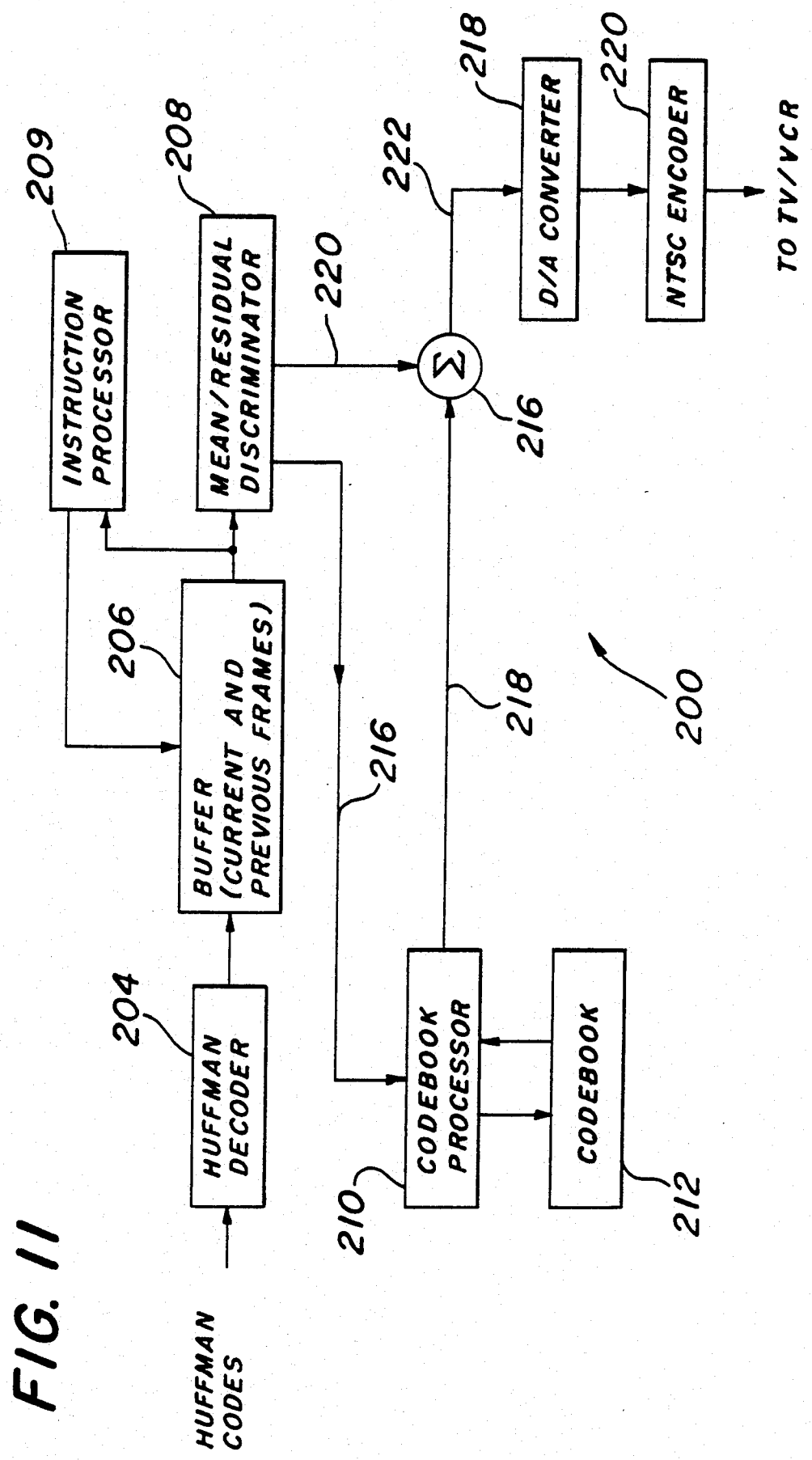

IMAGE COMPRESSION METHOD AND APPARATUS EMPLOYING DISTORTION ADAPTIVE TREE SEARCH VECTOR QUANTIZATION WITH AVOIDANCE OF TRANSMISSION OF REDUNDANT IMAGE DATA

RELATED APPLICATION DATA

This is a continuation-in-part of co-pending application Ser. No. 359,496, filed May 31, 1989, now U.S. Pat. No. 5,124,791 issued Jun. 23, 1992, entitled "Frame-to-Frame Compression of Vector Quantized Signals and Other Post-Processing".

The subject matter of this application is related to the subject matter of the following co-pending patent applications:

U.S. Ser. No. 794,516, entitled "Image Compression Method and Apparatus Employing Distortion Adaptive Search Vector Quantization";

U.S. Ser. No. 794,491, entitled "Method and Apparatus for Transforming Between Fixed Rate Vector Quantized Data and Variable Rate Vector Quantized Data";

U.S. Ser. No. 794,493, entitled "Progressive Transmission of Vector Quantized Data"; and, U.S. Ser. No. 794,487, entitled "Apparatus for Method Low Frequency Removal in Vector Quantization."

FIELD OF THE INVENTION

The present invention relates generally to a data compression method and apparatus. More particularly, the present invention relates to a method and apparatus for vector quantizing image data according to a distortion adaptive tree search vector quantization technique that avoids transmission of vector quantized data for redundant image data.

BACKGROUND OF THE INVENTION

The background of the present invention is described herein in the context of pay television systems, such as cable television systems, that distribute program material to subscribers, but the invention is by no means limited thereto except as expressly set forth in the accompanying claims.

Cable television operators receive much of their program material from remote earth stations via a plurality of geosynchronous orbit satellites. Typically, the cable operator selects the program material to be made available to its subscribers by making arrangements with the satellite distributors of that program material. Each cable operator then distributes the selected program material to its subscribers, via a coaxial cable distribution system, from its "cable head-end" where the material is received from the satellite. Frequently, cable operators also provide their own local programming at the site of the head-end, and further include network broadcasts as well. In DBS (direct broadcast satellite) applications, each subscriber is capable of receiving a satellite down-link directly.

Typically, in both types of systems (cable and DBS), the program material (comprising both video and audio) is transmitted as analog signals. Conventional transmission techniques place substantial limitations on the maximum number of viewer channels that can be transmitted over any given transponder on a satellite since each channel requires a minimum bandwidth to avoid noticeable degradation and the total number of channels that can be transmitted over a given satellite transponder is limited by the bandwidth of each signal, and of the transponders. Similarly, the electrical properties of coaxial cable limit its bandwidth and therefore place substantial limitations on the number of channels that can be delivered to cable television subscribers using conventional transmission techniques.

There is an interest in the pay television industry (including both cable television and DBS) to increase the number of channels that can be delivered to subscribers. However, to achieve this goal using conventional techniques would require more satellites and/or more transponders. There is also an interest in distributing HDTV (high definition television) signals to subscribers, but again, to achieve this goal using conventional techniques would require that some other programming be eliminated, or that additional satellites be placed in orbit or that more transponders be employed, since transmission of HDTV signals requires very high bandwidth. However, due to the limited number of locations in the geosynchronous orbit belt, placing more satellites in orbit is impractical, not to mention expense. Additionally, there is a finite number of transponders that can be placed on each satellite, and transponder space is at a premium, and rental is expensive. Insofar as cable transmission is concerned, conventional techniques allow expansion of the number of channels that can be transmitted, but only by expensive upgrading or rebuilding of the cable system.

Digital image transmission techniques have been investigated for overcoming this problem. Digital image transmission offers the advantage that digital data can be processed at both the transmission and reception ends to improve picture quality. However, the process of converting the program material from analog form to digital form results in data expansion. Thus, if the digitized program material were to be transmitted in raw digital form, the number of channels that could be transmitted over the satellite, or over the cable, would decrease, rather than increase.

Digital data compression techniques may be employed to maximize the amount of digital information that can be transmitted. Lossless compression techniques, such as Huffman encoding and LZW (Lempel, Ziv and Welch) encoding, offer, at best, compression ratios of 2.5 to 1 and do not sufficiently compensate for the amount of data expansion that occurs in converting data from analog to digital form.

A number of so-called "lossy" compression techniques have been investigated for digital image compression. DCT (discrete cosine transform) is one known method. Another method, which, until recently, has been used principally for speech compression, is vector quantization. Vector quantization has shown promise for offering high compression ratios, and high fidelity image reproduction. It has been demonstrated that, using vector quantization (hereinafter sometimes referred to as "VQ"), compression rates as high as 25:1, and even as high as 50:1, can be realized without significant visually perceptible degradation in image reproduction.

Compression of video images by vector quantization involves dividing the pixels of each image frame into smaller blocks of pixels, or sub-images, and defining a "vector" from relevant data (such as intensity and/or color) reported by each pixel in the sub-image. The vector (sometimes called an "image vector") is really nothing more than a matrix of values (intensity and/or color) reported by each pixel in the sub-image. For example, a black and white image of a house might be defined by a 600×600 pixel image, and a 6×6 square patch of pixels, representing, for example, a shadow, or part of a roof line against a light background, might form the sub-image from which the vector is constructed. The vector itself might be defined by a plurality of gray scale values representing the intensity reported by each pixel. While a black and white image serves as an example here, vectors might also be formed from red, green, or blue levels from a color image, or from the Y, I and Q components of a color image, or from transform coefficients of an image signal.

Numerous methods exist for manipulating the block, or sub-image, to form a vector. R. M. Gray, "Vector Quantization", *IEEE ASSP Mag.*, pp. 4-29 (April, 1984), describes formation of vectors for monochrome images. E. B. Hilbert, "Cluster Compression Algorithm: A Joint Clustering/Data Compression Concept", Jet Propulsion Laboratory, Pasadena, CA, Publ. 77-43, describes formation of vectors from the color components of pixels. A. Gersho and B. Ramamurthi, "Image Coding Using Vector Quantization", *Proc. IEEE Int. Conf. Acoust., Speech, Signal Processing*, pp. 428-431 (May, 1982), describes vector formation from the intensity values of spatially contiguous groups of pixels. All of the foregoing references are incorporated herein by reference.

By way of example, a television camera might generate an analog video signal in a raster scan format having 600 scan lines per frame. An analog to digital converter could then digitize the video signal at a sampling rate of 600 samples per scan line. Digital signal processing equipment could then store the digital samples, and group them into vectors.

Before quantizing an image, a vector quantizer stores a set of "codevectors" in a memory called a codebook. Codevectors are vectors which are chosen to be representative of commonly found image vectors. For example, one codevector might be a 6×6 pixel solid black patch. Another codevector might have all white pixels in the top three rows, and all black pixels in the bottom three rows. Yet another codevector might have a gradient made up of white pixels in the top row, black pixels in the bottom row, and four rows of pixels in between having shades of gray from light to dark. The quantizer stores a sufficient variety of codevectors in the codebook so that at least one closely matches each of the many image vectors that might be found in the full image. Typically, a codebook of representative codevectors is generated using an iterative clustering algorithm, such as described in S. P. Lloyd, "Least Squares Optimization in PCM", *Bell Lab. Tech. Note,* (1957) (also found in IEEE Trans. Inform. Theory, Vol. IT-28, pp. 129-137, March (1982); and, J. T. Tou and R. C. Gonzalez, "Pattern Recognition Principles", pp. 94-109, Addison-Wesley, Reading, MA (1974). Both of these references are incorporated herein by reference.

Each codevector is assigned a unique identification code, sometimes called a label. In practice, the identification codes, or labels, are the memory addresses where the closest codevector to the image vector is found. (In the appended claims, the term "ID code" is sometimes employed to refer to these labels or addresses,) Compression is achieved by replacing the codevector in the codebook which most closely matches the image vector by the label, or memory address.

By way of example, the codevector having the solid black patch described above, might be assigned address #1. The codevector having the white pixels in the top half and black pixels in the bottom half might be assigned address #2, and so on for hundreds or thousands of codevectors. When quantizing a full image, a vector quantizer divides the full image frame into a series of image vectors. For each image vector, the vector quantizer identifies one closely matching codevector. The vector quantizer then generates a new signal made up of the series of labels, or memory addresses where the codevectors were found in the codebook. For the example of a full image of a house, the vector quantizer would divide the full image into numerous image vectors. The quantizer might then replace image vectors from shadowed areas with address #1 (the solid black patch), and it might replace the roof line image vectors with address #2 (white in the top half and black in the bottom half). Compression results because, typically, the length of the labels or addresses is much smaller than the size of the codevectors stored in memory. Typically, the addresses are transmitted by any conventional technique so that the image can be reconstructed at the receiver.

Reconstruction of the original full image at the receiver (or at least a very close approximation of the original image) may be accomplished by a device which has a codebook, identical to the codebook at the transmitter end, stored in a memory. Usually, the device that performs vector quantization and compression at the transmitter is called an encoder, and the device that performs decompression and image reproduction at the receiving end is called a decoder. The decoder reconstructs (at least an approximation of) the original image by retrieving from the codebook in the decoder the codevectors stored at each received address. Generally, the reconstructed image differs somewhat from the original image because codevectors do not usually precisely match the image vectors. The difference is called "distortion." Increasing the size of the codebook generally decreases the distortion.

Many different techniques for searching a codebook to find the codevector that best matches the image vector have been proposed, but generally the methods can be classified as either a full search technique, or a branching (or tree) search technique. In a full search technique, the vector quantizer sequentially compares an input image vector to each and every codevector in the codebook. The vector quantizer computes a measure of distortion for each codevector and selects the one having the smallest distortion. The full search technique ensures selection of the best match, but involves the maximum number of computational steps. Thus, while distortion can be minimized using a full search technique, it is computationally expensive. Y. Linde, A. Buzo and R. Gray, "An Algorithm For Vector Quantizer Design", *IEEE Transactions on Communications*, Vol. COM-28, No. 1 (January 1980), incorporated herein by reference, describes the full search technique and the computational steps involved in such a search. The full search technique is sometimes called "full search vector quantization" or "full search VQ".

The tree search technique reduces the number of codevectors that must be evaluated (and thus reduces search time), but generally does not guarantee that the minimum distortion vector will be selected. A tree search technique can be considered as one that searches a sequence of small codebooks, instead of one large codebook. The codebook structure can be depicted as a tree, and each search and decision corresponds to advancing one level or stage in the tree, starting from the root of the tree. A detailed description of the tree search technique may be found in R. M. Gray and H. Abut, "Full Search and Tree Searched Vector Quantization of Speech Waveforms," *Proc. IEEE Int. Conf. Acoust., Speech, Signal Processing*, pp. 593-96 (May 1982), and R. M. Gray and Y. Linde, "Vector Quantization and Predictive Quantizers For Gauss Markov Sources", *IEEE Trans. Comm.*, Vol. COM-30, pp. 381-389 (February 1982), both of which are incorporated herein by reference. The tree search technique is sometimes referred to as "tree-search vector quantization", "tree-search VQ" and "TSVQ." Tree-search VQ, this technique has found favor for compressing dynamic images, since it is computationally faster. However, tree-search VQ does not guarantee selection of the optimum vector, and therefore requires a larger codebook to achieve the same distortion as full search VQ.

The process of vector quantizing data can be either "fixed rate" or "variable rate." Fixed rate VQ occurs when all of the transmitted address data has the same length, and a vector address is transmitted for all vectors in the image. Generally speaking, variable rate VQ offers the advantage that the average rate at which VQ data is transmitted is less than the rate that would be experienced if transmission of fixed rate VQ data were employed for the same image at the same distortion level. In the context of pay television systems, this advantage can be significant, since it can represent a much greater increase in the number of channels that can be carried over existing media (such as satellite and cable) than would be realized if fixed rate VQ were employed.

Several techniques are available for implementing variable rate VQ. In one technique, the quantity of compressed data generated by an image depends on the image content. For example, a variable rate VQ system might employ two different vector sizes. A large vector size might be used to describe simple parts of the image, and a small vector size might be used to describe complex parts of the image. The amount of compressed data generated depends on the complexity of the image. Sung Ho and A. Gersho, "Variable Rate Multi-Stage Vector Quantization For Image Coding", University of California, Santa Barbara (1988) (Available as IEEE Publ. No. CH 2561-9 88 0000-1156) teach one such technique. This reference is incorporated herein by reference. A disadvantage of this type of variable rate VQ is that the decoder is always more complex than a fixed rate VQ decoder since the decoder requires a video buffer store to reconstruct the image, whereas a fixed rate VQ decoder does not.

Another variable rate VQ scheme is described in E. A. Riskin, "Variable Rate Vector Quantization of Images", Ph. D. Dissertation—Stanford University, pp. 51 et seq. (May, 1990), incorporated herein by reference. Riskin employs an "unbalanced" tree structured codebook. An "unbalanced" tree structure is simply an incomplete tree; in other words, some branches of the tree may extend to further levels of the tree than other branches. As is common in tree search VQ, Riskin's codebook is searched by advancing from level to level along selected branches. Encoding will occur at different levels of the tree (in part due to the unbalanced structure of the tree), thereby achieving variable rate VQ, since the address length is a direct function of the level from which a codevector is selected. One disadvantage of this system is that encoding is not adaptive in any sense, and therefore the Riskin system does not perform variable rate VQ in a most optimal fashion.

Copending U.S. patent application Ser. No. 794,516 entitled "Image Compression Method and Apparatus Employing Distortion Adaptive Tree Search Vector Quantization" describes one method for achieving high transmission rates through use of a variable rate VQ scheme that employs a distortion measure to determine the level of the tree from which codevectors will be selected for each input image vector. In general, in the invention disclosed in this application, simple parts of the image can be adequately reproduced by a short address indicating a vector near the root of the tree, while more complex parts of the image may require a vector at a lower level (i.e., closer to the bottom) of the tree, requiring a longer codebook address. In television images in particular, as well as other video images such as movies, etc, it has been observed that a rather high degree of image redundancy may exist from one image frame to the next. Moreover, it has been observed that, to the extent that subsequent image frames are not fully redundant, many portions of subsequent image frames may nonetheless be redundant. Still further, within an image frame, a large degree of coherence, and thus redundancy, may be found between adjacent portions of the frame. Thus, even lower transmission rates may be accomplished by deleting the redundant or nearly redundant vector quantized data from data to be transmitted to the decoder. In other words, there is no need to send vector quantized data for image vectors that are identical, or substantially similar to, image vectors for which vector quantization data has previously been transmitted, since the decoder may simply copy the relevant reproduced image vectors. The present invention adapts this recognition to a distortion adaptive tree search vector quantization method to substantially decrease the transmission rates that can be realized without perceptible distortion or degradation in the quality of reproduced images.

SUMMARY OF THE INVENTION

According to the invention, a variable rate encoder vector quantizes input vectors characteristic of portions of images and transmits vector quantized data to a remote decoder for reconstruction of substantial representations of the images. The method comprises first receiving data indicative of an image to be compressed, organizing the image data into blocks, then converting each block to a multi-dimensional input vector. According to one embodiment of the invention, a previously received input vector (one that has already been vector quantized) is compared to a current input vector to obtain a first measure of difference between the previous input vector and the current input vector. If the first measure of difference is less than a threshold, then a "copy previous vector" instruction, rather than vector quantization data, is generated, Huffman encoded, and stored in a FIFO buffer for transmission to the decoder. The instruction is essentially a command to the decoder to copy its reconstructed representation of the previous input vector to provide a representation for the current input vector. The next input vector in sequence is then processed.

If it was determined that the first measure of difference is greater than the threshold value, then the current input vector is vector quantized. According to the invention, this is performed by a distortion adaptive vector quantization technique wherein, first, a mean value of the current input vector is determined, then the mean value is removed from the current input vector to obtain a residual vector. A tree structured codebook having plural levels of codevectors is provided. Each codevector in the codebook is representative of a possible residual vector, and each successive level of codevectors represents the possible residual vectors in greater detail than a preceding level of codevectors. A memory address is associated with each codevector.

A second measure of difference between the current input vector and the mean value is obtained, then compared to the threshold. If the second measure of difference is less than the threshold value, then only the mean value is stored in the FIFO buffer for transmission to the decoder. However, if the second measure of difference exceeds the threshold value, then the following steps are performed: (i) an initial level of the codebook is selected; (ii) the residual vector is compared to the codevectors at the selected level, and the codevector that most closely resembles the residual vector is selected; (iii) a third measure of difference between the selected codevector and the residual vector is obtained, then the third measure of difference is compared to the threshold value; (iv) the next level in the codebook is selected if the third measure of difference exceeds the threshold value; and (v) steps (i) through (iv) are repeated until either (1) the third measure of difference does not exceed the threshold value, or (2) a last level of the codebook has been reached, to obtain a finally selected codevector. The finally selected codevector is stored in the FIFO buffer for transmission to the decoder.

Data is stored in the FIFO buffer at a variable rate. The foregoing method is repeated for each next input vector while sequentially transmitting the data stored in the FIFO buffer at a fixed data rate. Simultaneously, a measure of unused FIFO buffer capacity is maintained, and the threshold is periodically adjusted by automatically increasing the threshold value when the measure of unused FIFO buffer capacity indicates that unused capacity is decreasing, and by automatically decreasing the threshold value when the measure of unused FIFO buffer capacity indicates that unused capacity is increasing. Adjustment of the threshold value ensures that the buffer does not empty or overflow as a result of storing variable length data therein while transmitting the same at a fixed data rate. The length and amount of data that must be transmitted to the decoder to substantially reconstruct image frames is thus decreased by virtue of the fact that short instructions (as short as 1 bit), rather than vector quantized data, is transmitted for redundant, or nearly redundant input vectors (as defined by the first measure of difference).

According to a preferred embodiment of the invention, the "copy previous vector" instruction, the address of the finally selected codeword, and the mean value are compressed according to a Huffman encoding technique, and the compressed data is transmitted to the decoder.

According to another embodiment of the invention, all input vectors at the encoder are vector quantized to obtain a codebook address for each input vector. Prior to storing address data for a current input vector in the FIFO buffer, the address is compared to the address for a previous input vector. If the addresses are identical, then the "copy previous vector" instruction (or the compression code for the instruction) is stored in the FIFO buffer for the current input vector. However, if the addresses are not identical, then a measure of difference between the current and previous input vectors is calculated and compared to the threshold. If this measure of difference is less than the threshold, then the "copy previous vector" instruction is transmitted. However, if this measure of difference exceeds the threshold, then the vector quantized data for the current input vector is transmitted.

The previous vector to which the current input vector is compared may be an immediately preceding vector in the same image frame, or it may be a corresponding vector (i.e., corresponding spatially) in a previous frame.

According to this embodiment of the invention, each remote decoder contains a Huffman decoder for retrieving the transmitted mean values and codevector addresses from the received data, and any "copy previous vector" instructions in the data stream. The decoder preferably has a memory for storing the incoming Huffman decoded data on a frame by frame basis. The decoder also has a tree structured codebook that is substantially identical to the codebook at the encoder. The decoder employs each received address to retrieve from its codebook the codevector residing at the received address to reproduce a substantial representation of the residual vector. The received mean value is added to the reproduced representation of the residual vector to reproduce a substantial representation of the input vector. The decoder is also responsive to receipt of each "copy previous vector" instruction to copy a previous vector that it received, for example, at the same location in the previous frame.

In a most preferred embodiment of an encoder according to the invention, an actual mean value (AMV) is calculated for each input vector (IV) and a processed mean vector (PMV) is computed therefrom. The PMV is a vector that is interpolated from the AMV of the current IV and from the AMV of vectors that surround the current IV in the current frame. The PMV for the current IV is compared to the current IV to obtain a measure of difference (first measure of difference) therebetween. If the first measure of difference is less than the threshold value, then the AMV for the current IV is Huffman encoded and only the Huffman code is stored in the buffer for transmission to the decoder, i.e., vector quantization is not performed and, for this IV, only the AMV is transmitted. The process is repeated for the next IV.

If the first measure of difference exceeds the threshold value, then a representation of the corresponding previous frame input vector is computed (RPFIV) and a measure of difference (second measure of difference) between the current IV and the RPFIV is obtained and compared to the threshold. If the second measure of difference is less than the threshold, then the AMV for the current IV is Huffman encoded and inserted into the buffer for transmission to the decoder. A Huffman encoded instruction to copy a corresponding "previous frame second residual codevector" is also stored in the buffer.

If the second measure of difference exceeded the threshold, then the PMV for the current IV is subtracted from the current IV to obtain a first residual vector (FRV). A mean value of the FRV is determined and subtracted from the FRV to obtain a second residual vector (SRV). The SRV is vector quantized according to the distortion adaptive vector quantization technique summarized above to obtain a second residual codevector (SRC) and an address therefor (SRCA). The AMV and the SRCA for the current input vector are Huffman encoded and stored in the buffer for transmission to the decoder. In the vector quantizer described above, the codebook stores "first residual codevectors", i.e., codevectors corresponding to input vectors with a mean value once removed. However, for reasons that will become evident hereinafter, the codebook employed in the vector quantizer of this most preferred embodiment stores "second residual codevectors", i.e., codevectors corresponding to input vectors with mean values twice removed.

The threshold is periodically adjusted based upon the unused capacity (i.e., fullness) of the buffer.

A decoder for use with this most preferred embodiment of the encoder preferably has a codebook of SRC's identical to the codebook in the encoder, and the decoder receives the Huffman encoded AMV and SRCA for each input vector, and retrieves the SRC from the codebook based upon the received Huffman decoded SRCA's. The decoder also preferably receives and stores all AMV's for a given frame of data. The decoder then calculates a PMV for the retrieved SRC based upon both the AMV received with the current SRCA and the AMV associated with surrounding vectors in accordance with an interpolation technique. The decoder then reproduces a representation of the input vector that resulted in the received SRCA based upon the retrieved SRC, the calculated PMV, and the received AMV. If a "copy previous frame second residual codevector" instruction was received, then the corresponding previous frame second residual codevector (PFSRC) is retrieved from the codebook, rather than the SRC, but the PFSRC is employed in the same manner as the SRC. Thus, the decoder reproduces a representation of the input vector that resulted in transmission of the "copy previous frame second residual codevector" instruction based upon the PFSRC, the calculated PMV, and the received AMV. If only an AMV was received, then the PMV is calculated and the decoder reproduces a representation of the input vector from the PMV only.

At the decoder, the reproduced representations of the input vectors are employed to create a substantial representation of each image frame so that the image may be displayed and/or recorded by a user employing the decoder.

Other features of the invention will become evident from the following drawings and specification.

Description of the Drawings

FIG. 6 illustrates an exemplary memory for storing a codebook.

FIG. 9 is a flowchart illustrating further details of the operation of the apparatus of FIG. 7.

FIG. 10 is a block diagram illustrating further details of the apparatus of FIG. 7 and the method of FIGS. 8A-8C.

FIG. 11 is a block diagram of one embodiment of a decoder apparatus for carrying out vector quantization decompression according to the present invention.

DETAILED DESCRIPTION OF THE DRAWINGS

Before proceeding to the description of the drawings, it should be understood that, although the invention is described herein in the context of broadcasting television signals, such as movies and the like, in a pay television system, the present invention is in no way limited thereto. Rather, the present invention may be employed wherever it is desired to compress and transmit any type of data, including conventional (i.e., free) television broadcasts, image data, voice data, etc.

Figure 1:
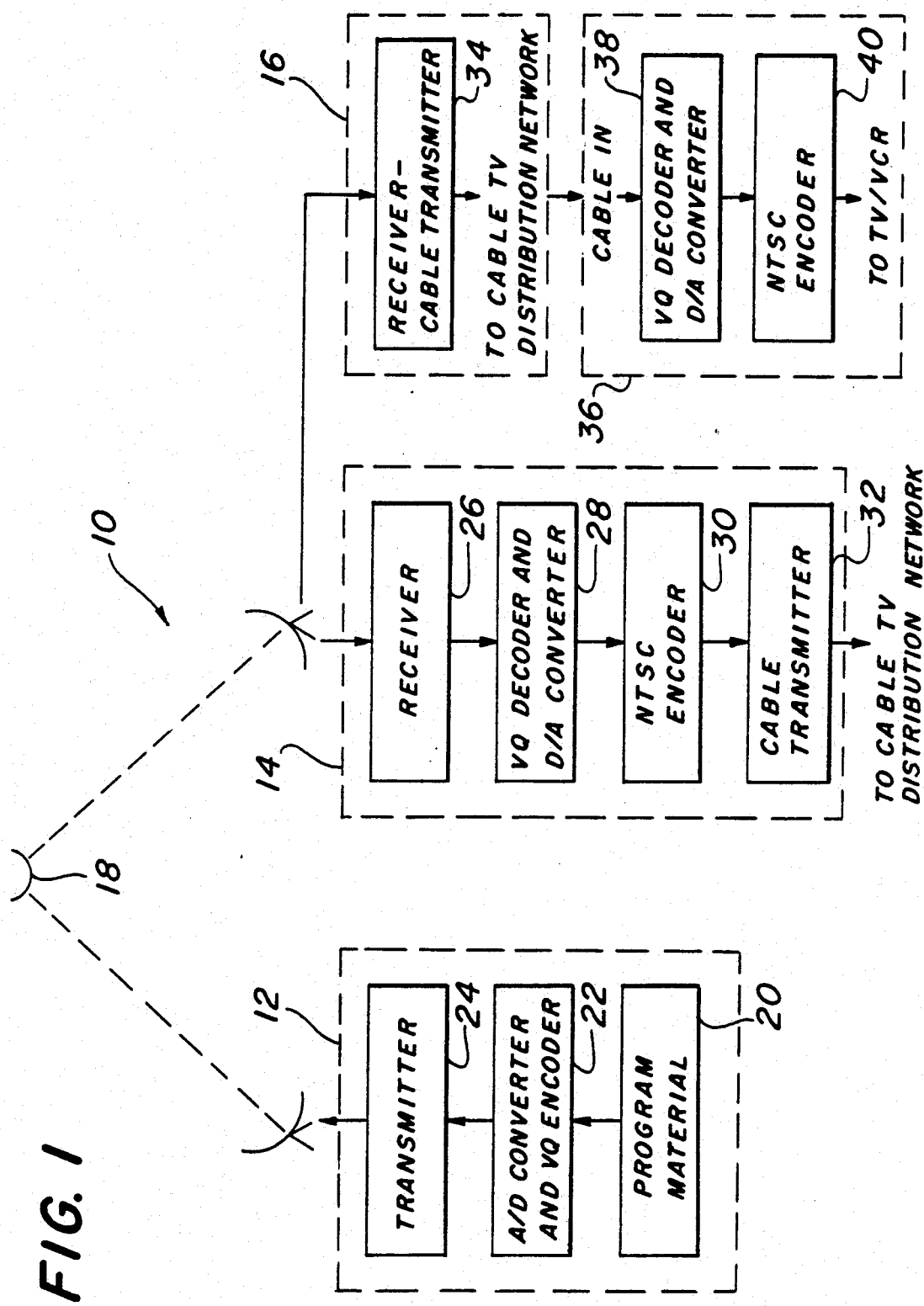
FIG. 1 is a block diagram illustrating an application of the present invention to a pay television system employing satellite communication to transmit program material.

Referring now to the drawings, wherein like numerals indicate like elements, there is illustrated in FIG. 1 an exemplary application of a vector quantization image compression system according to the present invention wherein moving image data (e.g., television signals, such as movies, etc.) is communicated from a point of origin 12 to receiving locations such as 14 or 16. Typically, the point of origin 12 might include a source 20 of program material that supplies movies, and the like in analog form to an apparatus (encoder) 22 for digitization and data compression by vector quantization. Details of apparatus 22 will be supplied hereinafter. Compressed, digitized data is transmitted to a satellite 18, via transmitter 24, for reception by a plurality of earth stations such as 14 or 16. The earth stations 14, 16 may be the head-end of a cable television distribution system of the type which receives signals from the satellite 18 and distributes them to a plurality of subscribers via coaxial cable. Alternatively, as will be explained in connection with FIG. 2, one or more of the earth stations may be DBS (direct broadcast satellite) subscribers who receive signals directly from the satellite 18. The term "pay television" and "pay television subscriber" is used in the instant specification and accompanying claims to encompass both cable television and direct broadcast satellite applications. However, as mentioned above, the invention is by no means limited to pay television systems, but has application to conventional (i.e., free) television transmission and reception.

Returning now to the cable television application of FIG. 1, there is shown two types of cable head end installations 14, 16 that may receive the down-link from the satellite 18. The cable head-end installation 14 may employ the received data in a different manner than the cable head end installation 16, however, the end result (availability of image data for display or recording) is the same to the cable television subscribers of each system. The two examples of cable head-end installations 14, 16 are shown to demonstrate the versatility of the present invention.

The cable head-end installation 14 may receive the data transmitted by the station 12 via receiver 26, then employ an on-site apparatus (decoder) 28 for decompressing the received data and converting the same back to analog form. Another on-site apparatus 30 may convert the analog data to conventional NTSC signals for transmission over the cable to subscribers in conventional form. Thus, in the case of cable head- end installation 14, the cable head-end operator distributes analog NTSC cable television signals to subscribers in conventional form.

In the case of the cable head end installation 16, the data transmitted by station 12 may be received via a receiver/transmitter 34 that conditions the received data for transmission over the cable system to cable television subscribers. That is, the operator of the cable head end system 16 does not decode or decompress the received data, nor does it convert the same to analog form. Rather, the operator of the cable head-end system 16 simply transmits the compressed image data over cable television system for receipt by the subscribers. Subscribers of the system 16 must therefore be provided with VQ decoder boxes 36 (described in detail hereinafter), whereas subscribers to the system 14 may employ conventional set-top decoders. The VQ decoder boxes 36, in general, comprise a VQ decoder 36 for decompressing received data and converting the same to analog form and an apparatus 40 for converting the analog data to NTSC format for display on a TV or recording on a VCR. The decoder box 36 may be embodied as a set-top decoder, or may be built into a television set or VCR.

While subscribers to the system 16 must use the above-described decoder box 36, an advantage of the system 16 is that, due to the highly compressed nature of the image data sent over the cable distribution network by the cable operator, many more channels may be transmitted over the cable to subscribers as may be transmitted over the cable in the system 14. Alternatively, the system 16 enables transmission of HDTV signals without sacrificing other channel space.

Figure 2:
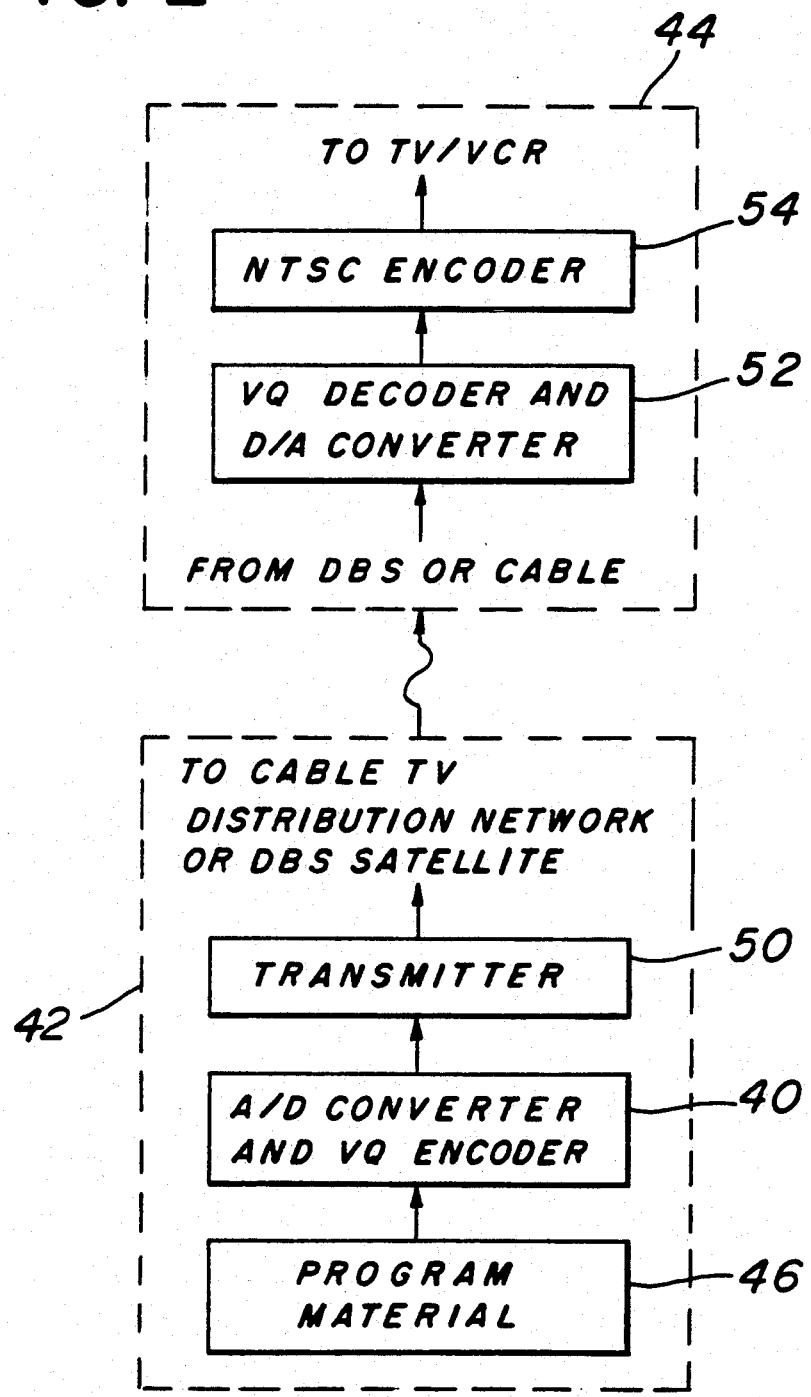
FIG. 2 is a block diagram illustrating another application of the invention to a pay television system employing cable or direct broadcast satellite for transmitting program material.

FIG. 2 illustrates another application of the present invention, also to a pay television system. In the system of FIG. 2, block 42 represents a cable or DBS head-end. The operator of the head end 42 may insert program material 46 (such as network television stations, video tapes, etc.) directly at the locale of the head-end for transmission (via either cable or DBS) to the subscribers. Thus, as shown in FIG. 2, the head-end 42 may include an apparatus (encoder) 48 for digitizing and compressing the locally provided program material 46, and a transmitter 50 for transmitting data from encoder 48 (again, via either cable or satellite) to each of the subscribers. The encoder 48 may be of the same type as encoder 22.

Each subscriber to the system of FIG. 2 is equipped with a decoder box 44 (that may be identical to the decoder box 36 of FIG. 1) that comprises apparatus (decoder) 52 for decompressing received data and converting the same to analog form. The decoder 44 may also be provided with apparatus 54 for placing the analog data into NTSC format for display on a television set or for recording via a VCR. As in the case of decoder box 36, the decoder 44 may be embodied as either a set-top decoder box, or may be built into a television set or VCR.

Figure 3:
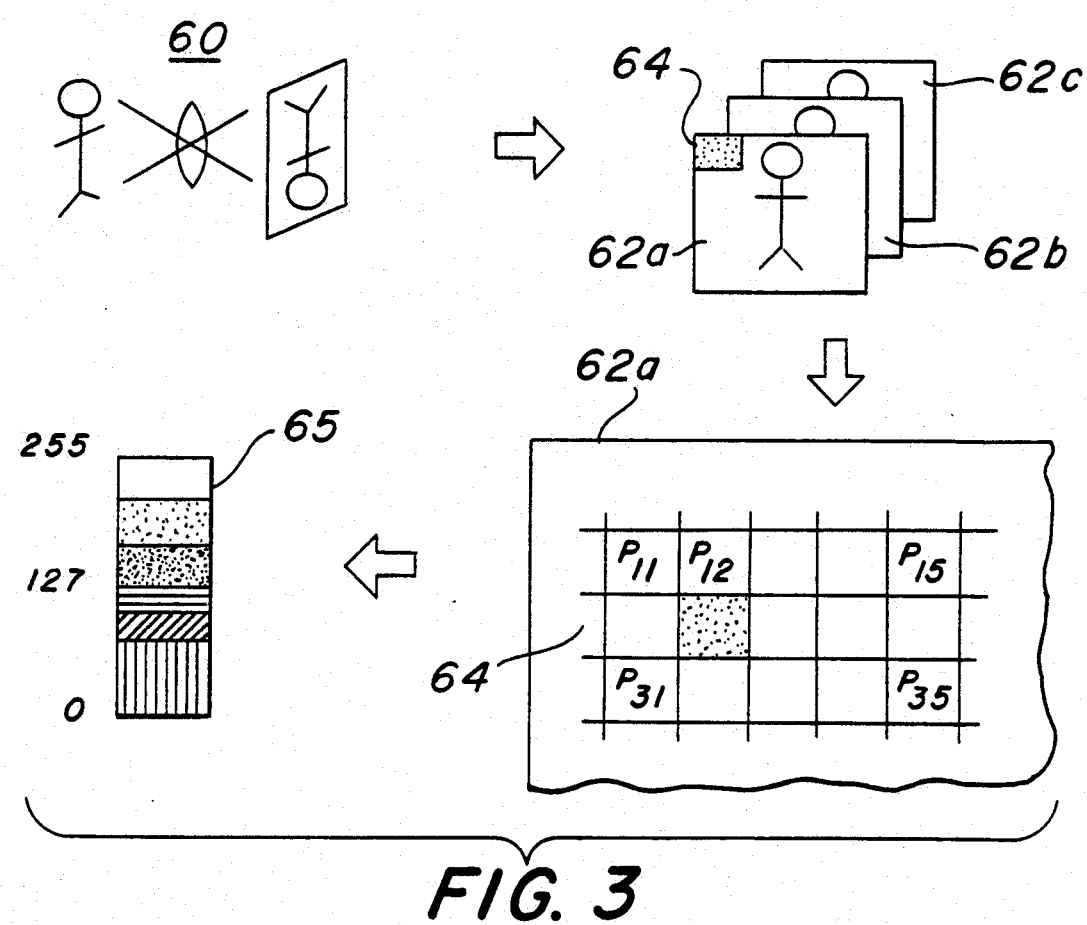
FIG. 3 graphically illustrates the concept of constructing input (image) vectors from pixels of temporally spaced image frames.
Figure 4:
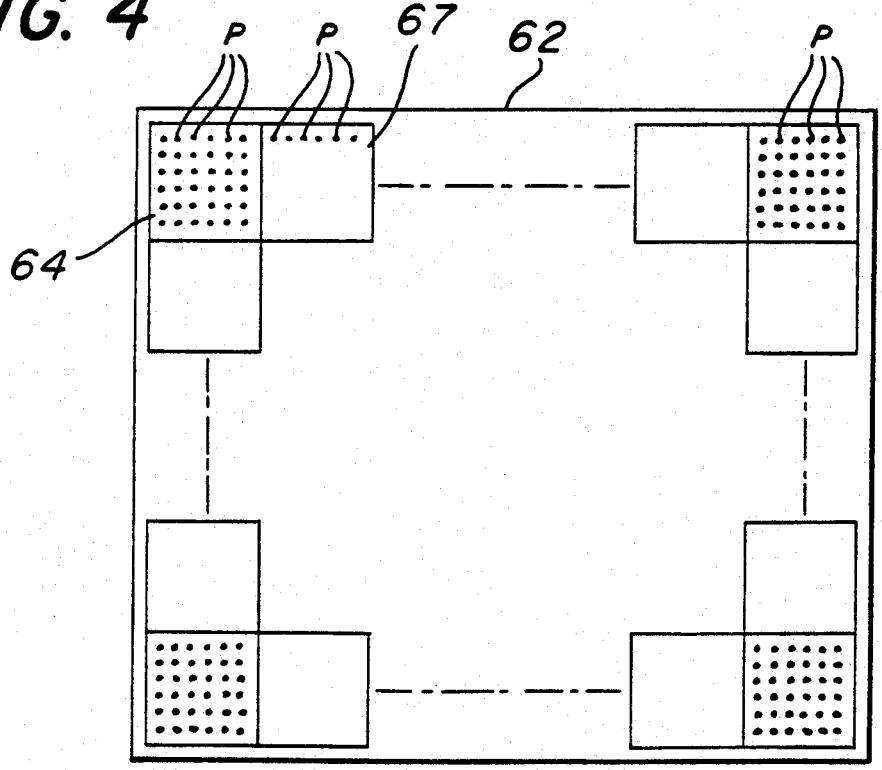
FIG. 4 graphically illustrates an image frame as defined by a plurality of pixels.

FIG. 3 illustrates the concept of converting moving or dynamic images 60, such as program material 20 or 46, into input image vectors for vector quantization. The concept illustrated in FIG. 3 is well known. See, for example, R. L. Baker, "Vector Quantization of Digital Images", Ph.D. Dissertation, Stanford University, Department of Electrical Engineering (1984); Gray, R. M., "Vector Quantization", *IEEE ASSP Mag.*, Vol. 1, pp. 4,29 (April 1984); Goldberg, M., Boucher, P. R. and Shlien, S., "Image Compression Using Adaptive Vector Quantization", *IEEE Comm.*, Vol. COM-34 No. 2 (February 1986); and, Nasrabadi, N.M. and King, R.A., "Image Coding Using Vector Quantization; A Review", *IEEE Comm.*, Vol. 36, No. 8 (August 1988). As shown in FIG. 4, and as is common in the art, each of the temporally spaced image frames 62a, 62b, 62c, etc. representing the moving image 60 is defined by a plurality of pixels P. In the case of a black and white image, each pixel P reports an intensity value, whereas in the case of a color image, each pixel may report luminance and chrominance values, or other values indicative of a color associated with the pixel.

As mentioned in the background section above, in vector quantization of an image, e.g., image frame 62a, the pixels P of each image frame are grouped into blocks that define sub-images of each image frame. Each of these blocks, which is a matrix of pixels, defines an input image vector. Thus, in FIG. 3, a sub-image 64 of image frame 62a is represented by the block of pixels $P_{11}, P_{12}, \ldots P_{35}$. This matrix of pixels defines one input image vector for image frame 62a. Image frame 62a, as well as each succeeding image frame 62b, 62c, etc., will usually be represented by a plurality of input image vectors.

As graphically shown at 65 of FIG. 3, the intensity and/or color values reported by each pixel P are digitized (by the A/D converter shown at 22 and 48 of FIGS. 1 and 2). For example, each intensity or color value may be represented by an 8 bit digital word such that 256 intensity and/or color levels are possible for each pixel. Thus, in the case of a black and white image, only one input vector, containing the intensity values reported by each pixel in the block, is required for each block or sub-image. However, in the case of a color image, it may be desirable to provide several input image vectors for each block or sub-image, e.g., one input image vector containing intensity data and another containing color data. Another possibility is that three input image vectors are provided for each block in a color image, one containing Y data, another containing I data, and a third containing Q data. According to the vector quantization technique, each of these input image vectors is then compared to the codevectors stored in the codebook to select a best match codevector for each.

It will be appreciated from the foregoing that, in the case of image data, input vectors will usually be multi-dimensional and usually have at least two dimensions (e.g., the matrix of intensity values shown in FIG. 3). However, there may be instances where input vectors are uni-dimensional, for example, where input vectors are constructed from the intensity values of only single rows or columns of pixels. Input vectors may have more than two dimensions, for example, where input vectors are constructed from pixel blocks of temporally spaced images (known as three dimensional vector quantization), and/or where data in addition to intensity data (e.g., color) is included in each vector.

A one-to-one logical correspondence exists between vectors in each image frame 62a, 62b, etc. For example, the spatial area covered by the vector 64 of image frame 62a corresponds exactly to the spatial area covered by the vector 64 in each previous frame 62b, 62c, etc. The logical correspondence is spatial area. Other logical correspondence relationships may also be used. For example, the spatial area covered by vector 67 of any given image frame, e.g., image frame 62a, is usually the same as the spatial area covered by any other vector, e.g., vector 64, in the same image frame. By way of further example, and as discussed above, there may be redundancy, or at least substantial similarity, between the logically corresponding vectors 64 of a current image frame 62a and a previous image frame 62b. Also by way of example, there may be redundancy, or at least substantial similarity, between the vector 67 and the vector 64 within a given image frame, e.g., image frame 62a. The present invention capitalizes upon such redundancies and similarities to decrease the total amount of data that is transmitted rate, as set forth in greater detail below.

Figure 5:
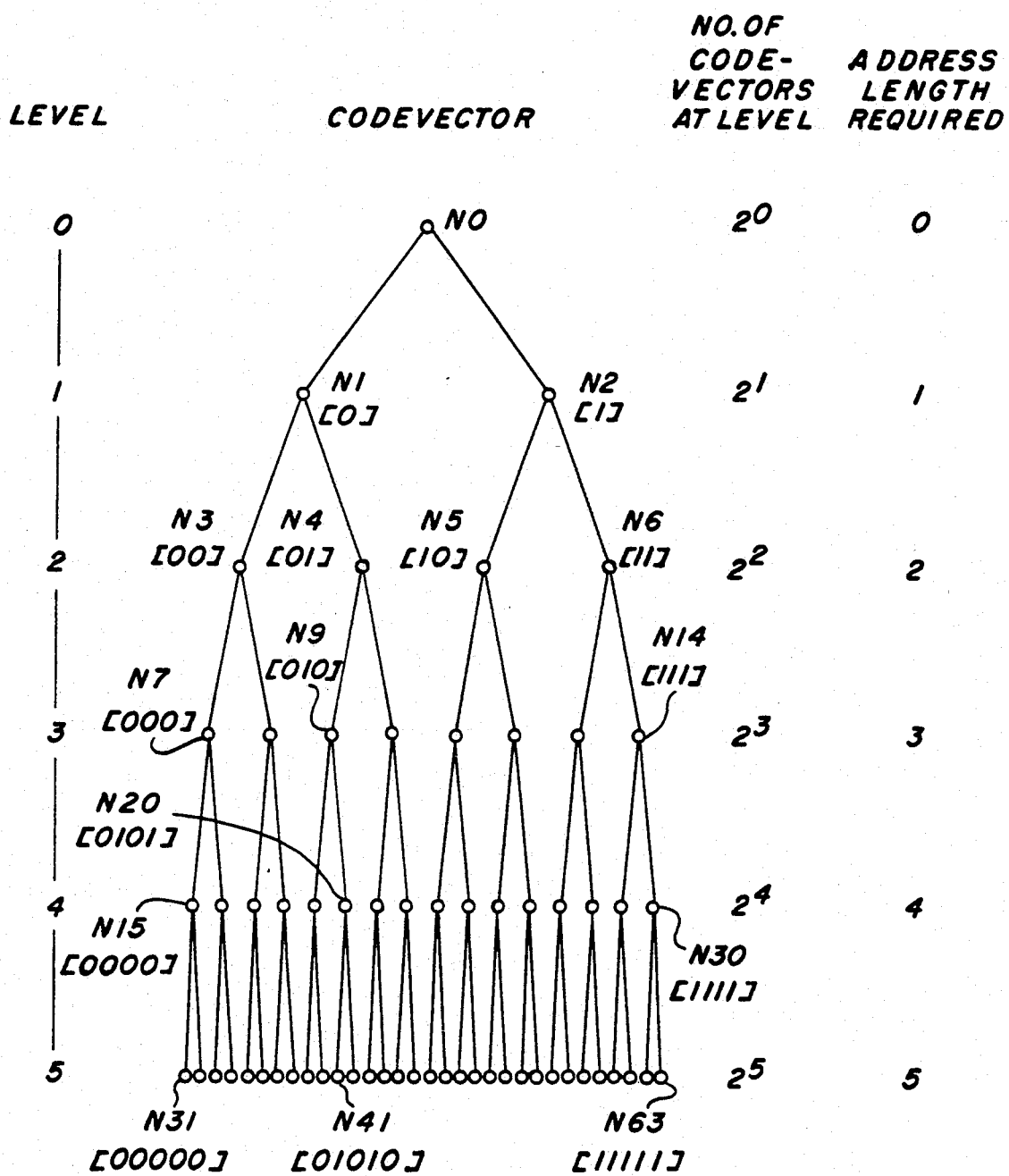
FIG. 5 illustrates the organization of an exemplary tree search VQ codebook that may be employed in connection with the practice of the present invention.

According to the present invention, a tree structured codebook is employed. FIG. 5 graphically illustrates the structure of an exemplary tree search VQ codebook that may be employed. The construction and use of tree search codebooks to perform vector quantization is well known in the art. See, for example, the aforementioned article by R. M. Gray entitled "Vector Quantization", and the aforementioned Ph.D. dissertation of R. L. Baker entitled "Vector Quantization of Digital Images". See also the aforementioned Ph.D. dissertation of E. A. Riskin entitled "Variable Rate Quantization of Images", and, U.S. Pat. No. 4,878,230 of Murakami et al. entitled, "Amplitude Adaptive Vector Quantization System." The aforementioned article by Linde, Buzo and Gray entitled "An Algorithm for Vector Quantizer Design" describes one preferred method for constructing codebooks that may be employed in the practice of the present invention.

The exemplary tree search VQ codebook of FIG. 5 comprises a plurality of levels 0-5 of codevectors wherein level 0 is defined by a root node N0 of the tree and subsequent levels are defined by additional nodes N1-N62 that are reached as branches of the tree are traversed. Each node is actually a codevector, so the exemplary codebook of FIG. 5 has 63 codevectors N0-N62. As shown in FIG. 6, the codevectors (CV) are stored in a memory M and each codevector CV has an associated address which serves as the ID code, or label, discussed in the background section above. As also mentioned in the background section, compression results because the address length is typically much shorter than the length of each codevector.

As is known to those skilled in the art, in a typical tree search VQ codebook, the codevectors at each successive level of the tree usually represent possible input vectors with greater accuracy than codevectors at a preceding level. Thus, the codevectors at level 5 of the exemplary tree of FIG. 5 may represent possible input vectors with greater accuracy than the codevectors at level 4, and the codevectors at level 4 may represent possible input vectors with greater accuracy than the codevectors stored at level 3, and so on. Such a tree search vector quantization codebook structure is well known in the art. Additionally, codevectors higher up in the tree (e.g., level 0 and 1) do not require such a long address to access the memory as do codevectors lower in the tree (e.g., levels 4 and 5), since there are fewer choices in the upper levels than in the lower levels, and a longer address length is needed to specify lower levels of the tree in any event. Thus, in the exemplary codebook of FIG. 5, an address length of 5 bits is required to address one of the $2^5$ codevectors in level 5, whereas an address length of 3 bits is required to address one of the $2^3$ codevectors in level 3, etc. Thus, the memory addresses have a variable length wherein the length of the addresses increases with each successive level of codevectors, and moreover, the address specifies not only a corresponding codevector, but also the level in the tree in which that codevector can be found. It will therefore be appreciated that, if a search technique were to be implemented wherein codevectors are selected from different levels of the tree, addresses of varying length will be provided, thus causing variable rate transmission. The present invention employs such a technique. For purposes of the following discussion, and in the drawing, the addresses of some codevectors are indicated in brackets ("[]").

Considering the structure of a tree search codebook in greater detail and referring to the tree search codebook of FIG. 5 as an example, it can be seen that successive levels of the tree search codebook are formed by branches emanating from each node in a preceding level. Thus for example, from the root node N0, the first level of the tree search codebook of FIG. 5 is formed by the branches to N1 and N2; the second level is formed by the branches from N1 to N3 and N4 and the branches from N2 to N5 and N6. As shown in the Figure, two branches emanate from each node at a given level until the bottom level of the tree is reached. It is understood by those skilled in the art that while the tree search codebook of FIG. 5 has two branches emanating from each node, other tree search codebooks may be used in accordance with the present invention that have more branches emanating from each node.

The address length of each codevector depends upon the number of branches emanating from each node as well as the level of the tree at which the codevector resides. In typical applications, VQ codebooks are stored in a digital electronic memory wherein the addresses are binary. In general, then, the length of the binary address of a codevector at a given level (L) can be expressed as:

Address Length = $L(\log_2 b)$ bits, where b = the number of branches emanating from each node. Thus, for example, in the tree search codebook of FIG. 5, where there are two branches emanating from each node, the codevectors of the first level of the codebook (residing at N1 and N2) require an address length of only 1 bit. The codevectors at each successive level of the tree search codebook of FIG. 5 require 1 additional address bit. The 5th level of the codebook, therefore, requires 5 address bits. Applying the formula above to a tree search codebook having four branches emanating from each node, each successive level of codevectors requires two additional address bits. Similarly, in a codebook having eight branches emanating from each node, each successive level of codevectors requires three additional address bits, and so on.

With binary addressing, the address of a codevector (node) at a given level of the tree comprises the address of the parent node in the preceding level plus the number of bits necessary to distinguish that codevector from the other codevectors (nodes) having the same parent node. As described above the number of additional bits depends on the number of branches emanating from the parent node and can be expressed as:

$\log_2 b$ bits, where b = the number of branches emanating from the parent node. Thus, for example, referring to the tree search codebook of FIG. 5 wherein two branches emanate from each node, the address of the codevector at N4 is [01] which comprises the address of the codevector at parent node N1 ([0]) plus an additional bit ([1]) to distinguish the codevector at N4 from the codevector at N3 which also has node N1 as a parent. Similarly, for example, the address of the codevector at N9 is [010] which comprises the address of the codevector at parent node N4 ([01]) plus an additional bit ([0]) to distinguish the codevector at N9 from the codevector at N10 which also has node N4 as a parent.

A result of the structure described above is that from the address of a codevector at a node in a lower level of the tree, the addresses of the codevectors at the parent nodes in preceding levels can be obtained by simply truncating the lower level address by $\log_2 b$ for each preceding level. Thus, for example, knowing the address of the codevector at N41 [01010] in the 5th level of the tree search codebook of FIG. 5, the address of the codevector at parent node N20 in the preceding 4th level is obtained simply by truncating the address of the codevector at N41 by 1 bit. Thus, the address of the codevector at parent node N20 is [0101] (i.e. [01010] with the last bit removed). Similarly, the address of the codevector at the parent node N4 in the 2nd level of the tree can be obtained by truncating 3 bits (5-2) from the bottom level address. Thus, the address of the codevector at N4 is [01] (i.e. [01010] with the last three bits removed).

Again, following from the above, if the address of a parent node at a given level L is known, the address of a codevector at a subsequent level L' can be specified with only $(L'-L)\log_2 b$ additional bits; in other words, having obtained the full address of a codevector at a parent node in level L of the tree, only $(L'-L)\log_2 b$ additional bits need be provided to uniquely identify the codevector in level L' having that parent, because the $(L'-L)\log_2 b$ additional bits can be combined with the previously obtained address of the parent node to obtain the full address of the codevector at the subsequent level L'. The $(L'-L)\log_2 b$ additional bits needed to identify the codevector at level L' represent the difference between the address of the parent node at level L and the full address of the codevector at level L'.

The number of codevectors in a tree search codebook can be expressed mathematically as:

$\Sigma b^L$, for L = 1 to N where
  N = total number of levels in the codebook;
  L = the Lth level of the codebook; and
  B = the number of branches emanating from each node of the codebook.

Thus, consider for example a tree search codebook having 10 levels and wherein 4 branches emanate from each node. Applying the formula above, the codebook would contain approximately 1.33 million codevectors. Suppose further, for example, that each codevector is constructed from a 3×4 matrix of pixels wherein each pixel represents an intensity value between 0 and 255. Each pixel would require 8 bits or 1 byte of memory storage, and therefore, each codevector would require 12 bytes of memory storage (3×4 pixels). Consequently, the codebook would require 16 Mbytes of storage.

Figure 7:
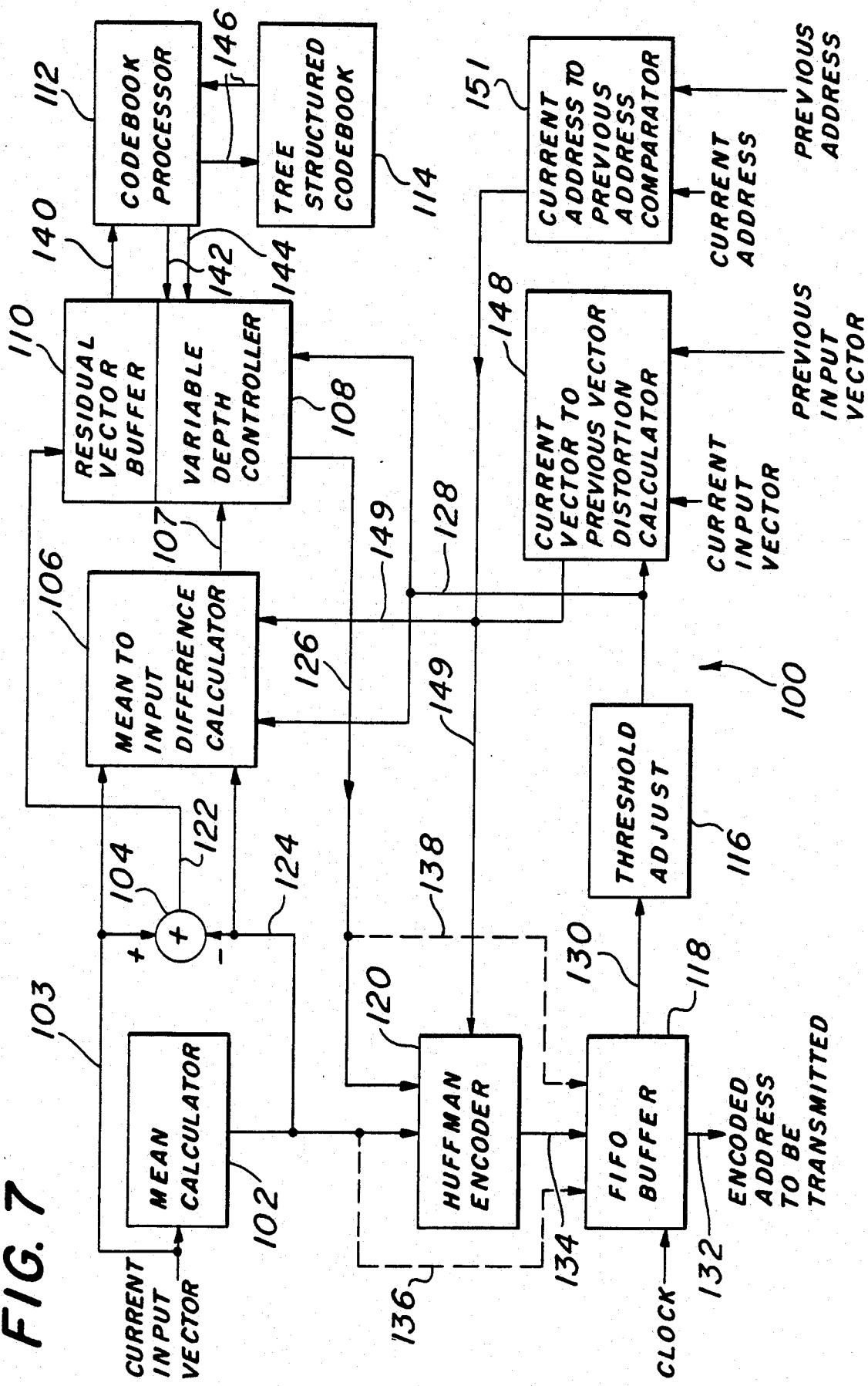
FIG. 7 is a block diagram of one embodiment of an encoder apparatus for carrying out the vector quantization compression method of the present invention.

In the prior art, vector quantization is commonly (but not always) carried out by searching each input vector all the way through to the bottom of the tree to find the codevector at the bottom of the tree that most closely resembles the input vector. According to the present invention, and as will be explained in detail below, the maximum level of the tree to which a search is carried out varies according to a variable threshold. More particularly, the level of the tree to which each search is carried out is governed by a measure of distortion between each input vector and the best match codevector at a particular level, and comparing the distortion measure to the threshold. (Actually, in the preferred embodiment, a residual vector, calculated from the input vector, is used to search the codebook, but the present invention is not limited thereto except as expressly set forth in the accompanying claims.) If the distortion measure is less than the threshold, the codevector at that particular level is selected. However, if the distortion measure is greater than the threshold, then the best match codevector at the next level of the tree is selected, and the process is repeated until the distortion measure is less than the threshold, or until the last level of tree has been reached. Further, the threshold preferably varies according to a "fullness measure" of a buffer that stores VQ data to be transmitted, which, in effect, causes the threshold to vary as a function the average length of VQ data stored in the buffer. Alternatively, a threshold value may be derived and fixed for a predetermined number of images which causes those particular images to generate a fixed amount of compressed data. FIG. 7, which illustrates a VQ encoder apparatus for carrying out this method, and FIGS. 8–10 which illustrate the method in greater detail, will now be explained.

Referring first to FIG. 7, there is illustrated a VQ encoder apparatus 100 for carrying out the method of the present invention. A current, or new, input vector (e.g., the digitized matrix 64 of pixel values taken from a portion of the image frame 62a) is received and supplied to a circuit 102 which computes the mean value of the input vector. The mean value is supplied on a line 124 to the "−" input of an adder circuit 104 which also receives on a "+" input, via line 103, the input vector itself. The mean value is also supplied to a Huffman encoder circuit 120 for purposes to be described hereinafter. The adder circuit 104 subtracts the mean value from the input vector to supply, on a line 122, a so-called "residual vector", which is the input vector with its mean value removed. As will become evident hereinafter, it is the residual vector that is used for searching the codebook to select a best match codevector. This style of vector quantization, known as mean removed vector quantization (MRVQ), is well known in the art and has numerous advantages. See, for example, the aforementioned article by R. M. Gray entitled "Vector Quantization" and the aforementioned Ph.D. dissertation by R. L. Baker entitled "Vector Quantization of Digital Images". Although the invention is described herein as employing MRVQ, this is simply the preferred embodiment, and the invention is not limited to use of MRVQ, except as may be expressly set forth in the accompanying claims. Rather, if desired, the input vector itself, or some other variant thereof, may be used to carry out the codebook search to select the best match codevector (in the claims, the term "processed input vector" has been employed to cover all such possibilities).

As shown, the mean value is also provided on line 124 to one input of a mean value to input vector distortion calculator 106, and the input vector is also provided on line 103 to another input of calculator 106. The function of the calculator 106 is to calculate a measure of difference between the mean value and input vector. This may be performed by converting the mean value to a vector, then computing a measure of difference between the mean vector and input vector by any well known technique, such as by computing the absolute difference of the vector elements, or by computing the square root of the difference between the squares of the elements. Also supplied as an input to the calculator 106, on line 128, is a threshold value whose magnitude is determined as hereinafter described. The calculator 106 determines whether the difference between the mean value and the input vector is less than or greater than the threshold value. The result of this decision is reported, via line 107, to a variable depth controller 108. The controller 108, which functions in accordance with the flowchart of FIG. 8, is responsible for carrying out vector quantization of each residual vector. As will become evident hereinafter, if the difference between the mean value and the input vector is less than the threshold, the variable depth controller 108 does not carry out vector quantization for this particular input vector. (Alternatively, if the difference between the mean value and the input vector is less than the threshold, the input vector could still be vector quantized and the result discarded. This approach offers the advantage that the hardware implementation may be simpler.) On the other hand, if the difference exceeds the threshold, then the controller 108 carries out vector quantization by conducting a search for the codevector that best matches the residual vector.

The residual vector calculated by adder 104 is provided via line 122 to a residual vector buffer 110. Buffer 110 stores the residual vector in the event that vector quantization is indicated by the output 107 of the calculator 106. In such case, the residual vector is provided to a codebook processor 112 via line 140. A preferred circuit for the codebook processor 112 is disclosed in U.S. Pat. No. 5,031,037 entitled "Method and Apparatus for Vector Quantizer Parallel Processing." The codebook processor 112 bi-directionally communicates with a tree structured codebook 114 (of the type previously described) via a pair of lines 146. As the codebook 114 is traversed, and the residual vector is compared to the codevectors at each level. The codebook processor 112 provides, on a line 142, the address of the best match codevector (e.g., per FIGS. 5 and 6), and also provides on a line 144, a measure of distortion between the current best match codevector and the current residual vector. The measure of distortion may be computed in the same manner as the measure of difference between the mean value and input vector is carried out. The manner in which this measure of distortion is employed will become evident hereinafter.

The variable depth controller 108 provides, on a line 126, the address of a finally selected codevector from the codebook 114. As shown, this address is preferably provided to the input of a Huffman encoder 120. As previously mentioned, the mean value provided by the calculator 102 is also provided to the Huffman encoder. As will be appreciated hereinafter, when the measure of difference between the mean value and input vector calculated by calculator 106 is less than the threshold, then only the mean value is supplied to the Huffman encoder 120, i.e., vector quantization for this particular input vector is not performed and therefore no address data is provided on line 126 to the Huffman encoder 120. (Alternatively, when the measure of difference between the mean value and input vector calculated by calculator 106 is less than the threshold, the input vector could still be vector quantized and the result discarded. This approach offers the advantage that the hardware implementation may be simpler.) In such event, the Huffman encoder will insert a code to indicate to a receiver of VQ data that only the mean value, and no address data, has been transmitted for this particular input vector.

According to one embodiment of the invention, the best match address provided on line 142 by the codebook processor 112 for any particular node of the codebook 114 may be a variable bit length address. In the tree of FIG. 5 which has a root node and 5 subsequent levels, one additional bit is needed to address each subsequent level of the tree. If the tree is completely traversed, a 5 bit address will be generated. Alternatively, if the tree is traversed to only the third level, only a 3 bit address will be generated. (In one preferred implementation, there are sixteen branches at each level and four bits are added as each new level of the tree is traversed.) It will be understood by those skilled in the art that the tree is traversed by branching only from a selected node (codevector) at a given level to one the subsequent nodes (codevector) reachable from the selected node. The controller 108 may convey the address of the finally selected codevector on line 126 in either a fixed rate or variable rate form. Thus, if desired, the controller 108 may place the raw address of the finally selected codevector on line 126. In such case, the length of the address will vary as the level to which searches are carried out in codebook 114 varies, i.e., the data on line 126 will be variable rate Alternatively, the controller 108 may always convert the address to a fixed length address so as to provide fixed rate VQ data on line 126.

As mentioned, both the VQ data (addresses) from the controller 108 and the mean value from calculator 102 are provided to a Huffman encoder 120. The Huffman encoder 120, however, is not needed if variable rate data is provided on line 126. Rather, the variable rate data may be provided directly to a buffer 118 (for purposes described hereinafter) via line 138. Additionally, it is not absolutely necessary to Huffman encode the mean values provided by the mean calculator 102. Thus, if desired, mean values may also be provided directly to the input of the buffer 118 via line 136. However, use of the Huffman encoder 120 is preferred, and it is preferred that the VQ data on line 126 be provided in fixed rate from when the Huffman encoder is employed.

Huffman encoders are well known in the art. While many different variations of Huffman encoders are known, all operate on essentially the same principle. A Huffman encoder is a lossless data compressor that, using a lookup table, assigns separable compression codes (addresses) based on the statistical probability that a particular entry in the lookup table will be addressed. That is, the greater the probability that a particular entry in the lookup table will be addressed, the shorter the compression code. Thus, the function of the Huffman encoder 120 is to assign compression codes to each address received on line 126, wherein the compression code assigned to each address received on line 126 has a length that is inversely proportional to a predetermined probability that the codevector associated with that address will be finally selected from the codebook 114. The Huffman encoder 120 also assigns compression codes to the mean values from the calculator 102 according to the same criteria.

It will be appreciated by those skilled in the art that vectors located at higher (i.e., upper) levels of the tree (having shorter address lengths) typically occur with more frequency than those at lower levels (i.e., closer to the bottom) of the tree although this is not necessarily always the case. Whatever the wordlength of the variable rate address, the Huffman encoder assigns wordlengths substantially based on the frequency of occurrence of a particular address (not on its length). Even in the case of fixed rate addresses, the Huffman encoder chooses variable length codes based on frequency of occurrence, and generates variable rate data.

Although a Huffman encoder has been shown for compressing the mean values and VQ (address) data, any lossless data compressor may be employed, however, a Huffman encoder is preferred.

The output of the Huffman encoder 120 is provided to the input of a first in first out (FIFO) buffer 118. If the Huffman encoder 120 is not employed, then the variable rate VQ data on line 126 may be provided directly to the input of the FIFO buffer 118 via line 138 and the mean value data may be provided as an input via line 136. A clock serially clocks in data from the Huffman encoder 120 (or from lines 136, 138) while synchronously transmitting out data stored in the FIFO buffer on output 132. The output 132 of FIG. 7 corresponds to the output of blocks 22 and 48 of FIGS. 1 and 2.

As previously mentioned, the magnitude of the threshold determines whether the residual vector will be searched in the codebook. If a search is called for, then the magnitude of the threshold also affects the level in the codebook to which a search is conducted. This threshold is variable according to a measure of "buffer fullness", or unused capacity of the FIFO buffer 118. A measure of buffer fullness is provided on a line 130 to a threshold adjust circuit 116 which is responsive to the measure of buffer fullness to increase or decrease the magnitude of the threshold. Accordingly, when the signal on line 130 indicates that unused buffer capacity is decreasing (as a result of incoming VQ data filling the buffer faster than it is being transmitted out), the threshold adjust circuit 116 automatically increases the magnitude of the threshold value. Similarly, when the signal on line 130 indicates that unused buffer capacity is increasing (as a result of VQ data being transmitted out faster than new VQ data is filling it), the threshold adjust circuit 116 automatically decreases the magnitude of the threshold value. Co-pending U.S. Pat. application Ser. No. 365,940, filed Jun. 13, 1989 entitled "Method and Apparatus for Data Compression With Reduced Distortion" discloses another application of a circuit that employs a measure of buffer fullness to adjust a value.

It will be appreciated that increasing the magnitude of the threshold value will increase the measure of difference that will be permitted between the mean value and input vector before vector quantization of the residual vector is called for. Increasing the magnitude of the threshold value will also decrease the average level to which searches are conducted through codebook 114. Decreasing the threshold value will have an opposite effect. Thus, increasing the threshold value will decrease the average length of variable rate addresses provided on line 126 (when controller 108 is programmed to provide variable rate addresses thereon), and it will decrease the average length of compression codes provided by Huffman encoder 120. Again, decreasing the threshold will have an opposite effect. It will thus be seen that, as the buffer 118 begins to approach its maximum capacity, the threshold is adjusted to effectively shorten the length of subsequent input data to the buffer 118 when variable rate data is provided on line 126, and vice versa. When the Huffman encoder is employed, threshold adjustment will affect the length of the compression codes as well. Thus, over time, the buffer will have an average capacity of preferably 50%. More importantly, however, automatic adjustment of the threshold guarantees that the buffer will not empty or overflow as a result of storing variable length data (i.e., either variable length compression codes from the Huffman encoder 120, or variable length addresses from the controller 108) while transmitting the same on line 132 at a fixed data rate.

As shown, there is also provided a calculator 148 which receives as inputs the current input vector and a previous input vector. (A buffer, not shown, for storing previous input vectors may be provided). The previous input vector may be the logically corresponding input vector from the immediately preceding image frame (e.g., the current input vector may be vector 64 of image frame 62a and the previous input vector may be vector 64 of image frame 62b), or it may be the immediately preceding vector from the same image frame (e.g., the current input vector may be vector 67 and the previous input vector may be vector 64, both of which are from image frame 62a). If input vectors from the previous frame are to be employed for this purpose, then a frame buffer, not shown, for storing the vectors from the entire previous frame may be required.) The variable threshold value is also provided on line 128 to the calculator 128. The function of calculator is to calculate a measure of difference between the current and previous input vectors and compare the measure of difference to the threshold value. An indication of the result of this comparison is provided on line 149 to calculator 106 and to Huffman encoder 120. If the measure of difference is less than the current threshold value, then calculator 106 is instructed on line 149 not to compute the input/mean difference for the current input vector, and calculator 106 further instructs controller 108, via line 107, not to perform a tree search for the current input vector. In this event, no vector quantization is performed for the current input vector and, instead, the Huffman encoder 120 is instructed to insert an encoded "copy previous vector" instruction, which may be embodied simply as a tag bit, into the buffer 118. Thus a very short instruction, which may as short as 1 bit, is stored and transmitted instead of the lengthier mean value and/or vector quantized data for the current input vector. The operation of this portion of FIG. 7 is further evident from the following explanation of FIGS. 8A-8C. It will appreciated that the operation of this portion of FIG. 7 serves to identify redundant, or at least substantially similar, vectors (based upon the varying threshold value) and avoids transmission of redundant or similar vector quantization data, thus increasing the transmission rate of data to the decoder.

According to another embodiment of the invention described below, ID codes (addresses) of vectors, either rather than or in addition to vectors themselves, may be compared in device 151 to eliminate redundancies and provide the "copy previous vector" instruction on line 149, as explained in more detail in the flowcharts of FIGS. 8A-8C.

The apparatus of FIG. 7 may be employed to implement blocks 22 and 48 of FIGS. 1 and 2.

Figure 8A:
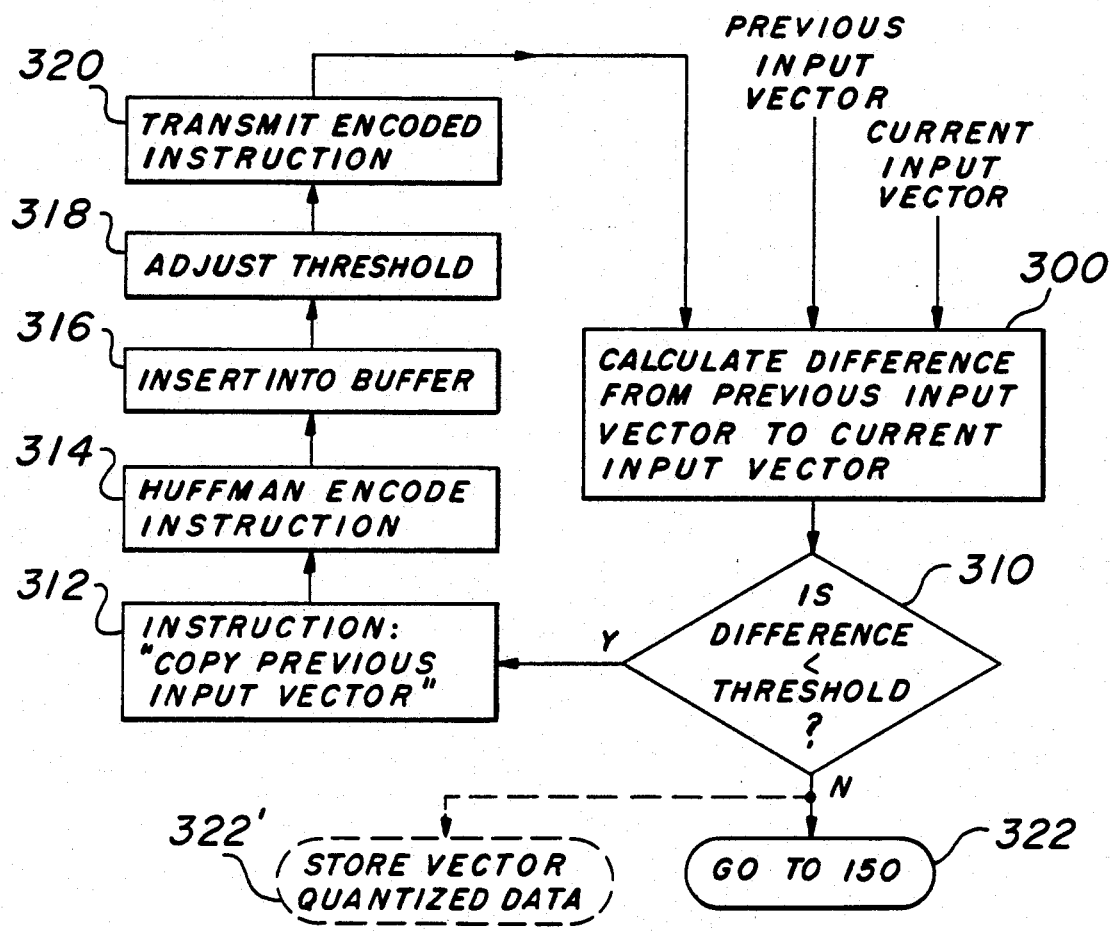
FIGS. 8A-8C are a flowchart illustrating both the operation of the apparatus of FIG. 7 and one preferred embodiment for carrying out the vector quantization compression method of the present invention.
Figure 8C:
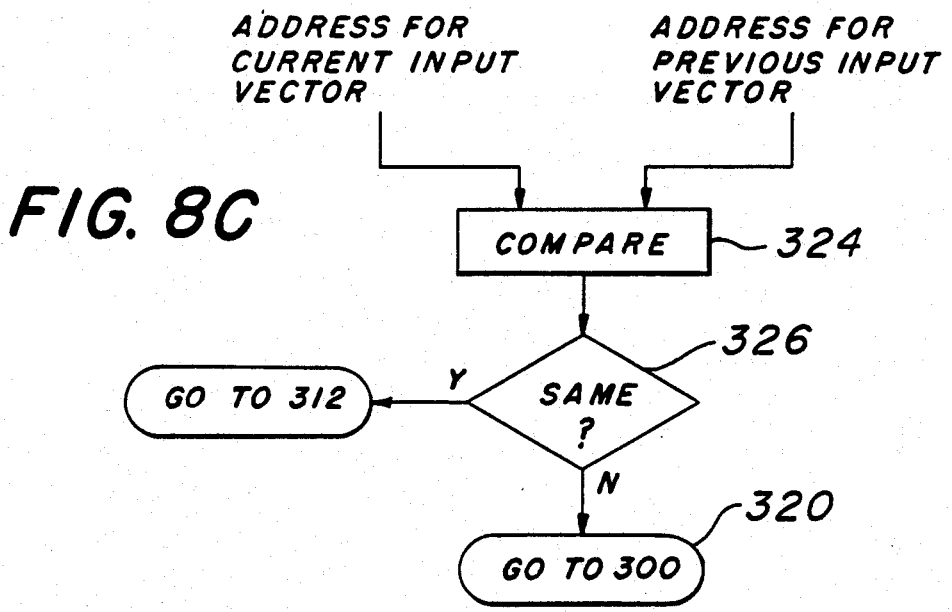
Figure 8B:
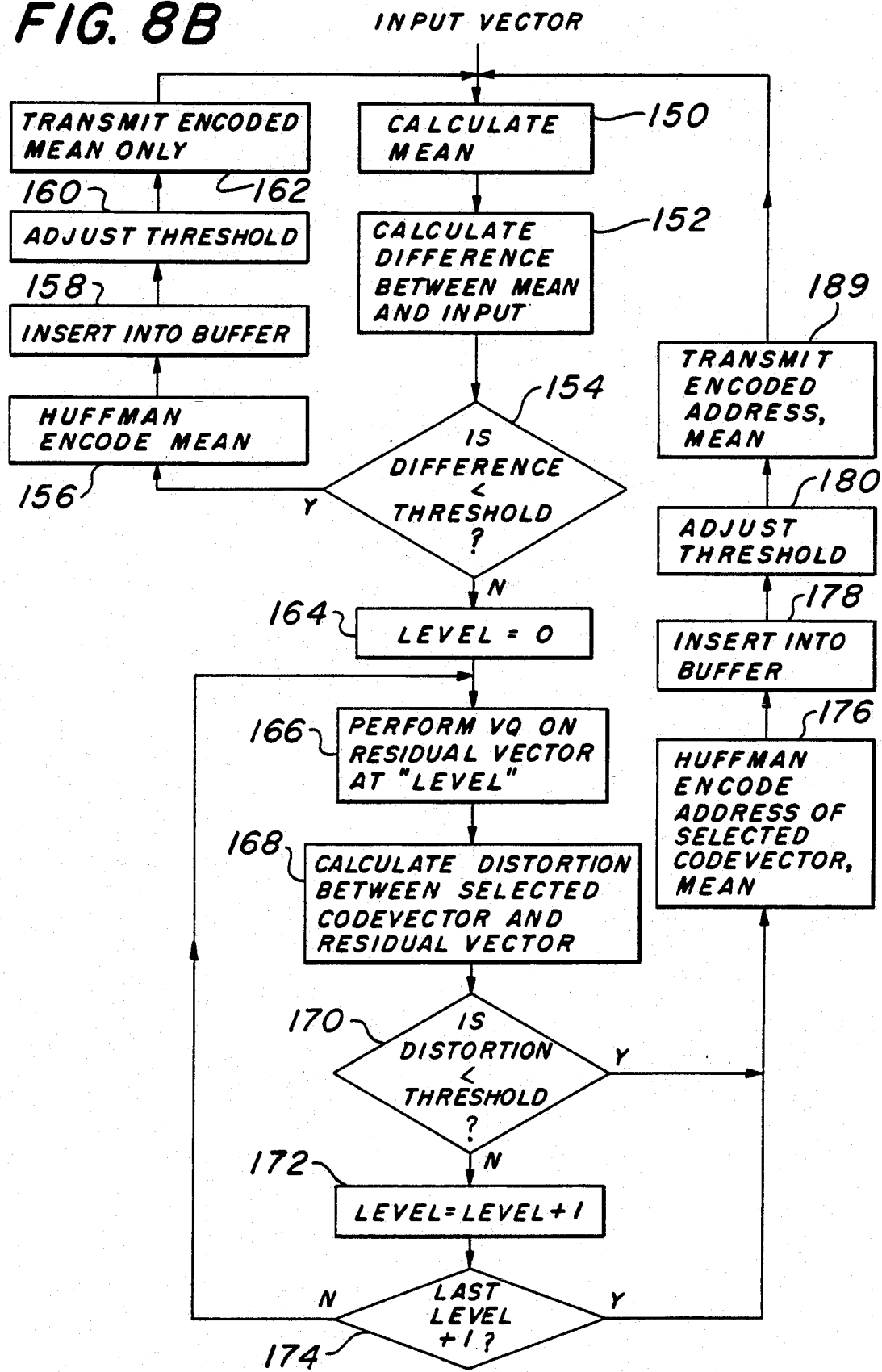

Before proceeding to an explanation of FIGS. 8A-8C, it would be helpful to provide a further explanation of the underlying principles of the redundancy identifying/elimination features of the present invention. For purposes of explanation only, these principles will explained in connection with a situation where ID codes (addresses) of logically corresponding vectors from temporally spaced image frames are employed to check for and eliminate redundancy, however, it should be understood that this example is not intended to be limiting and that these principles are applicable to comparison of vectors rather than ID codes, and also to avoid redundancy between vectors within an image frame.

As mentioned, the encoder 100 (and particularly device 148) may compare ID codes (addresses) from one frame (the "current" or "new" frame) to the corresponding ID code of a prior frame (the "previous" or "old" frame). If an ID code from the new frame is the same as the corresponding ID code from the old frame, the ID code from the new frame is eliminated from the series. A "tag bit" in the data stream stored in the buffer 118 is set to indicate that a vector has been eliminated. Consider, for example, a first frame which has been quantized to form a first series of ID codes:

$$\{F_1(1), F_2(1) \ldots F_{1,000}(1)\}$$

where "F" designates an ID code, the subscript designates the position of the ID code in the series for a particular frame, and the number in parenthesis designates the frame number. Consider also a second frame which has been quantized to form a second series of ID codes:

$$\{F_1(2), F_2(2), \ldots, F_{10,000}(2)\}.$$

The encoder 100 may compare the first ID code from the first frame $F_1(1)$ to the first ID code from the second frame $F_1(2)$ If the two codes are the same, the ID code from the second frame $F_1(2)$ can be eliminated.

Figure 13:
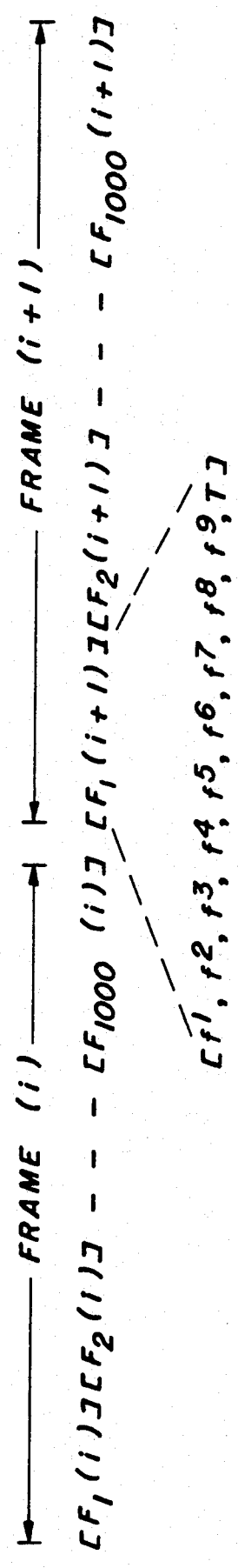
FIG. 13 is an algebraic representation of ID codes (address data) organized into image frames.

FIG. 13 shows an algebraic representation of the format of the output from the encoder 100 before redundancy elimination. The output is a series of frames Frame(i), Frame(i+1), ..., where each frame is a series of identification codes $F_1(i), F_2(i),,,,,,,$. In this example, each identification code is an exemplary ten bit binary number $F^1, \ldots, f^{10}$ followed by a tag bit T.

Figure 14:
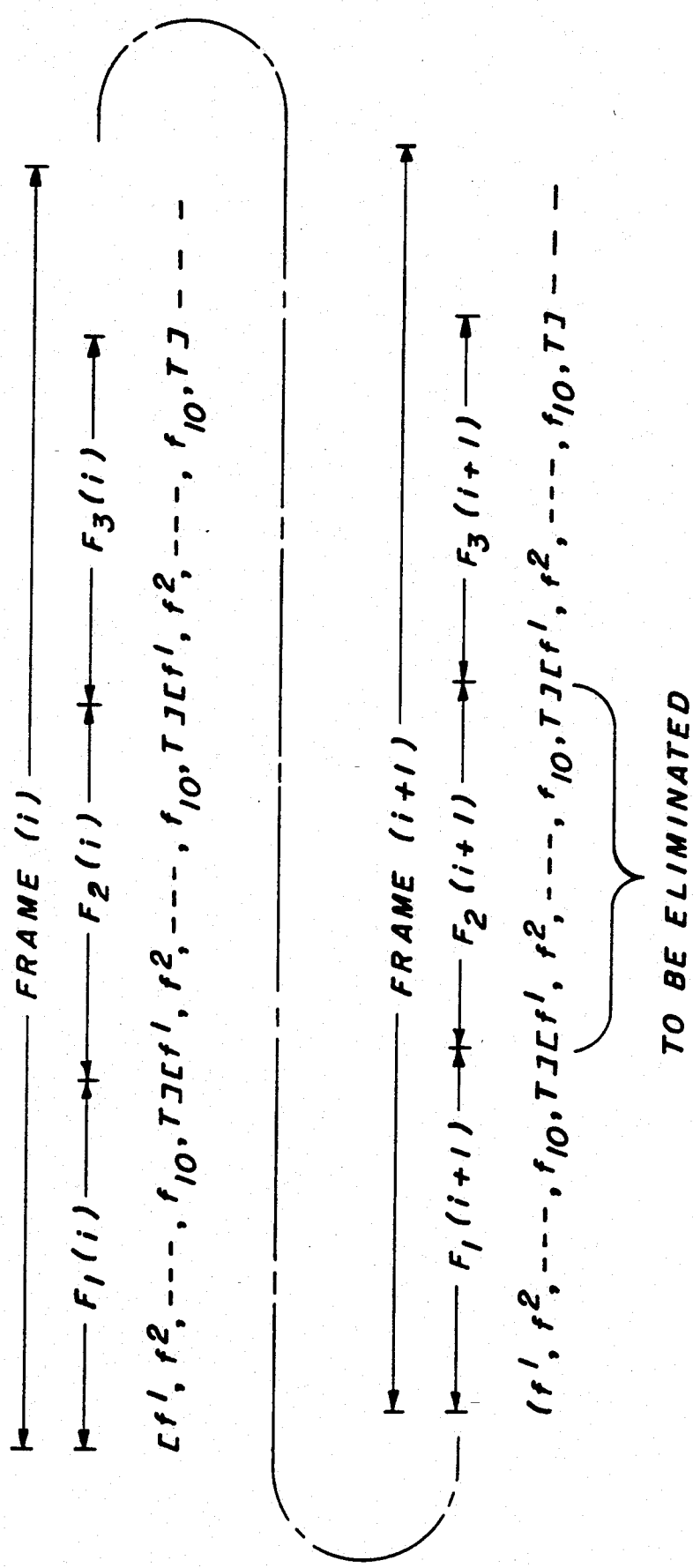
FIG. 14 is an algebraic representation of corresponding portions of two frames of ID codes.

FIG. 14 shows an algebraic representation of an exemplary output from the encoder 100 with ID codes. The second ID code of the second frame $F_2(i+1)$ is identified as one which will be eliminated.

Figure 15:
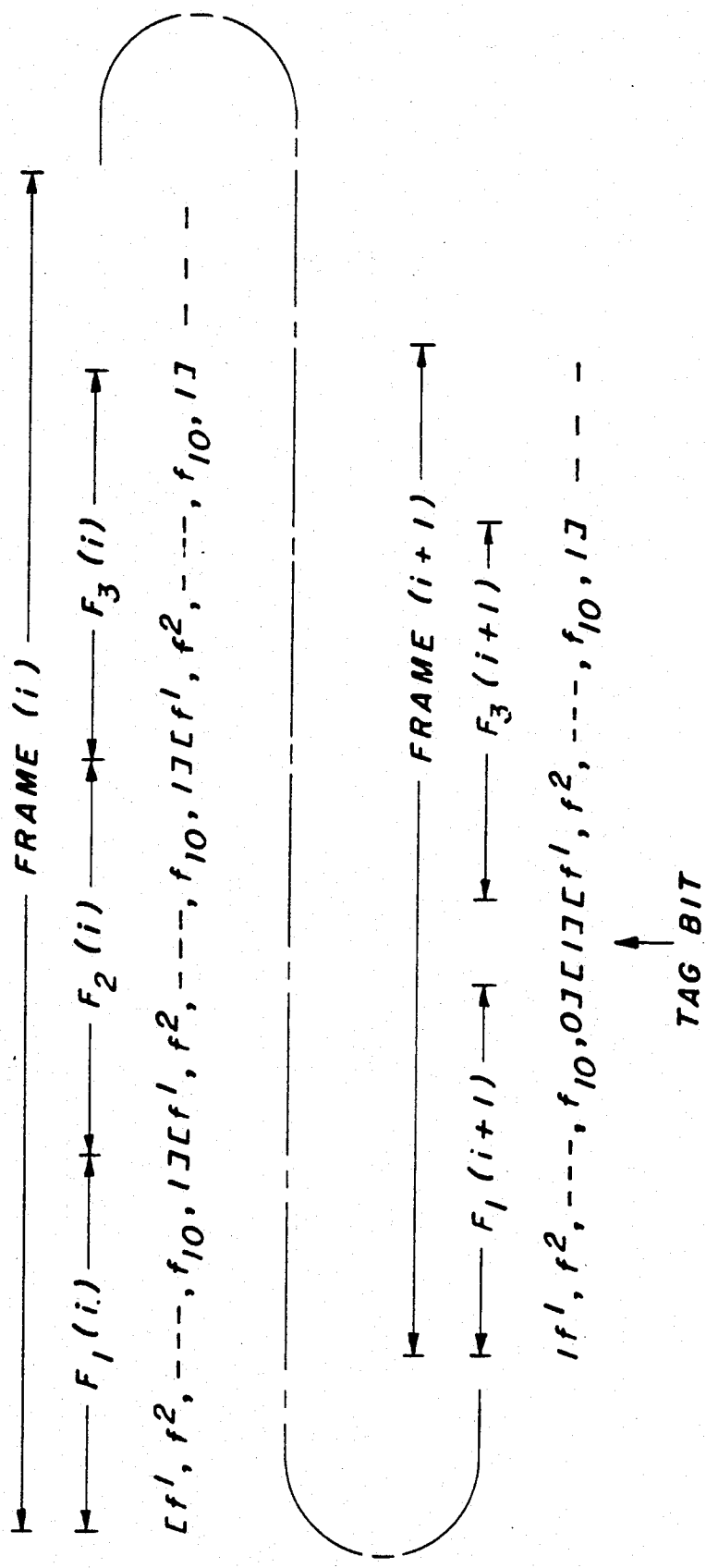
FIG. 15 is an algebraic representation of two frames of ID codes from which one redundant code has been eliminated.

FIG. 15 shows an algebraic representation of an exemplary output from the encoder 100 with redundancy elimination. The tag bit T of the first ID code of the second frame $F_1(2)$ has been set to "0" to indicate that the following ID code $F_2(2)$ has been deleted. The ten bits of the second ID code of the second frame $F_2(2)$ (having been deleted) are not shown, but the tag bit T remains. The tag bit T of the second ID code of the second frame $F_2(2)$ is set to "1" to indicate that the next ten bits are an ID code which has not been deleted.

As mentioned above, an ID code may also be eliminated if the underlying vectors differ by an insignificant amount (rather than being identical). The different $d(F_n(i), F_n(i+1))$ between two vectors can be defined mathematically and computed quantitatively. This difference is sometimes referred to herein as the "distance" (d) between the vectors.

In order to facilitate processing, a matrix of distances can be formed. Table I shows the organization of such a matrix.

TABLE I

| 0 | $d(A_1,A_2)$ | $d(A_1,A_3)$---- | $d(A_1,A_m)$ |
|---|---|---|---|
| $d(A_2,A_1)$ | 0 | $d(A_2,A_3)$---- | $d(A_2,A_m)$ |
| $d(A_3,A_1)$ | $d(A_3,A_2)$ | 0 ---- | $d(A_3,A_m)$ |
| . | . | . | . |
| . | . | . | . |
| . | . | . | . |
| $d(A_m,A_1)$ | $d(A_m,A_2)$ | $d(A_m,A_3)$---- | 0 |

Each row of the matrix corresponds to one codebook vector $A_j$. Each column of the matrix also corresponds to one codevector $A_j$. The entries in the matrix are the distances $d(A_1, A_j)$ between codevectors. Suppose, for example, that there are 1024 vectors in the codebook. There would be 1024 rows and 1024 columns in the matrix. The entry in the first column of the first row is the distance between $A_1$ and itself, which is zero. The entry in the second column of the first row is the distance between $A_1$ and $A_2$, which is given by the symbol $d(A_1,a_2)$. The entry in the last column first row is the distance between $A_1$ and $A_{1024}$. The second row of the matrix contains the distances between the second codevector $A_2$ and all other codevectors.

The matrix of Table I can be stored in memory, and distances between corresponding vectors of successive frames can be determined by retrieving them from memory, since the table is indexed by ID Code. In this way, ID codes can be processed in the codebook domain without the need to perform computations in the raw data domain. Also, from the table it can be appreciated that the distance $d(A_1,A_2)$ is the same as $d(A_2,A_1)$ Accordingly, it is necessary to store only half of the table in memory.

When a series of frames is compressed by eliminating redundancies as above described, a large number of frames may pass with little or no change to certain spatial areas. If, for example, the top rows of an image of sky remain unchanged while action occurs in the bottom half of the scene, ID codes for upper vectors may all be eliminated, and tag bits set to "0." In order to detect a change when it does occur, a memory stores the most recently transmitted ID codes for the full frame. New ID codes are compared to the last corresponding ID code from a previous frame which was not replaced with a tag bit.

Variations on this basic method exist which do not alter the fundamental approach. For example, the number of new vectors sent in a frame may be a fixed number N. Each frame is analyzed to determine the N vectors with the most distortion. Only the N most distorted vectors are transmitted. In this way, a fixed transmission rate can be achieved while minimizing the distortion at that transmission rate.

Co-pending U.S. patent application Ser. No. 359,496 now U.S. Pat. No. 5,124,791 issued Jun. 23, 1992, entitled "Frame-to-Frame Compression of Vector Quantized Signals And Other Post-Processing" provides additional details of the above described redundancy elimination method.

FIGS. 8A-8C are a flowchart illustrating a preferred operation of the circuit of FIG. 7, and particularly the operation of controller 108 and calculator 148. As shown in FIG. 8A, a previous input vector and the current input vector are compared at step 300. If the difference (i.e., distance) between them exceeds the threshold value, then steps 150 et seq. (FIG. 8B) are performed for the current input vector as shown at step 310, i.e., the current input vector is vector quantized. However, if the difference is less than the threshold, then a "copy previous vector" instruction should be generated, as shown at step 312. The Huffman encoder 120 is responsive to this event to provide an encoded instruction, which may be the tag bit described above, as shown at step 314. The encoded instruction, or tag bit, is stored in the buffer 118, as shown at step 316, then the threshold value is adjusted (in accordance with principles described below) as shown at step 318. The encoded instruction is transmitted at some time as shown at step 320, and the process is repeated for the next input vector.

As mentioned above, it is possible to compare ID codes (addresses) to check for redundancy. In such case, all input vectors must first be vector quantized (in accordance with the method of FIG. 8B, for example) to obtain their associated ID codes. Then, as shown in FIG. 8C, the ID codes (addresses) for the current and previous input vectors are compared (step 324). If the ID codes are identical, then steps 312 et seq. for the current input vector may be performed. If the ID codes are not identical, then it may still be possible to eliminate the current input vector's ID code from the data stream if the current input vector is substantially similar to the previous input vector. Thus, as shown at step 328, even if the ID codes are not identical, the distance between the current and previous vectors is obtained (step 300, FIG. 8A) and compared to the threshold (step 310). If the two vectors are substantially similar (as judged against the current value of the threshold), then the "copy previous vector" instruction is inserted into the data stream, rather than the ID code for the current vector, even though the addresses did not match. However, if the distance between the two vectors exceeds the threshold (i.e., they are not sufficiently similar as judged against the threshold value), then the vector quantized data for the current input vector (i.e., its mean value and/or ID code) is stored in the buffer 118 as shown at step 322'.

Turning now to FIG. 8B, upon receipt of the current input vector, its mean value is calculated as shown at step 150, then the difference (distortion) between the mean and input vector is calculated, as shown at step 152. At step 154, the difference is compared to the threshold value. If the difference is less than the threshold value, then the mean value is Huffman encoded as shown at step 156, and the Huffman code for the mean only is stored in the buffer 118, as shown at step 158. The Huffman encoder inserts a coded indication signifying that only the mean is present for this input vector and that no address data should be expected. Then, as shown at step 160, the threshold is adjusted based upon the measure of buffer fullness. At some time, after the Huffman encoded mean value has been clocked through the buffer to the output 138, it is transmitted, as shown at step 162.

If, at step 154, it was determined that the difference between the mean value and input vector exceeded the threshold, then vector quantization is performed upon the residual vector calculated for the current input vector. Steps 164 through 174 illustrate the manner in which vector quantization is performed for the residual vector according to the present invention. The controller 108 is responsible for carrying out steps 164 through 174 of FIG. 8B.

To perform vector quantization for a new residual vector, the first level of the tree structured codebook 114 is selected, as shown at step 164. Next, vector quantization is performed on the residual vector at this level to find the codevector at this level that most closely resembles the residual vector. At step 168, a measure of distortion is calculated between the selected codevector and the residual vector, and, at step 170, this measure of distortion is compared to the threshold. If the measure of distortion exceeds the threshold, then the next level of the codebook is selected, as shown at step 172, and, unless the process has already been performed for the last level of the tree (step 174), steps 166 through 170 are repeated for this next level of the codebook. The loop defined by steps 166 through 174 is repeated, for each subsequent level of the codebook, until the measure of distortion between the selected codevector and the residual vector is less than the threshold (step 170), or until the last level of the tree has been compared (step 174). Step 174 recites "last level+1" to indicate that the residual vector is encoded at the last level when the measure of distortion always exceeds the threshold, i.e., the loop is not exited until after encoding has been performed at the last level.

When a codevector has been finally selected (at either step 170 or step 174), its address, and the mean value associated with the current input vector, are Huffman encoded, as shown at step 176, and these Huffman codes are inserted into the buffer 118 as shown at step 178. The threshold value is thereafter adjusted as shown at step 180, and, when the Huffman codes for the current input vector have been clocked through the buffer 118, they are transmitted as shown at step 182.

As shown, the process is repeated for each input vector.

As shown in FIG. 8B, in the preferred embodiment, the threshold is adjusted between the receipt of each new input vector. Since an image is generally represented by a plurality of input vectors, the method shown in FIG. 8B may adjust the magnitude of the threshold value many times for a single image frame. However, if desired, the threshold value may be adjusted only between image frames. Thus, it may be desired to adjust the threshold only in-between the time that a last input vector for one image frame and a first input vector for a subsequent image frame are received.

FIG. 9 illustrates, in flowchart form, how the threshold value is adjusted according to the preferred embodiment of the invention. As Huffman codes (or variable rate addresses) are inserted into the buffer 118 (step 194), and also as serial data is transmitted out of the buffer at a fixed data rate (step 192), the threshold is recalculated as a function of buffer fullness. As previously mentioned, however, the threshold value provided to the controller 108 and the calculator 106 is adjusted only in-between receipt of input vectors.

As an alternative, the value of the threshold can be determined for one or more images. In this case, the value of the threshold is chosen by the encoder which causes those particular frames to generate the required fixed amount of data to match the transmission channel capacity. The value of the threshold can be found by the encoder, for example, using trial and error or an iterative search technique.

As mentioned, data bits are serially transmitted from the buffer 118.

FIG. 10 graphically illustrates the concept of employing buffer fullness to adjust the threshold value. As shown, remaining buffer capacity varies as a function of the length of the variable rate input data (either the Huffman codes or the variable rate addresses), since data is transmitted from the buffer 118 at a fixed data rate. As shown by the line inside the buffer 118 of FIG. 10, the threshold value increases toward a maximum as unused capacity decreases, and the threshold value decreases toward a minimum as unused buffer capacity increases. Theoretical considerations for establishing minimum and maximum threshold values are:

Min threshold=0;
Max threshold=absolute value of [maxpix−minpix]* numpix; or,
Max threshold=[maxpix - minpix]2 * numpix;
where:
  maxpix=maximum grey level of pixels;
  minpix=minimum grey level of pixels;
  numpix=block (sub-image) size However, in practice, max threshold can be set to a value smaller than the theoretical maximum since the theoretical value is not likely to ever occur. This ensures better buffer utilization without requiring an excessively large buffer.

Referring now to FIG. 11, there is shown a block diagram of an apparatus (decoder) for receiving VQ data transmitted by the buffer 118 and converting the same back to image data. The apparatus of FIG. 11 may be employed to implement blocks 28, 38 and 52 of FIGS. 1 and 2.

As shown, a Huffman decoder 204 receives and decodes the received data to obtain the transmitted address and mean value. These data are stored in a buffer 206. The buffer 206 stores an entire frame of address and mean data for both the current and immediately preceding frames for purposes that will become evident hereinafter. A discriminator circuit 208 retrieves the obtained address for the current vector and provides it on a line 216 to a codebook processor 210 that may be identical to the codebook processor 112 of FIG. 7. An instruction processor 209 also detects the presence of tag bits or "copy previous vector" instructions in the received data stream. If a tag bit or "copy previous vector" instruction is present, then the instruction processor simply copies the address (or mean) of the previous vector from the buffer 206 and provides it to the discriminator circuit 208 which, if the copied data is an address, provides it on line 216 to the codebook processor 210 for purposes described below.

The apparatus 200 of FIG. 11 is also provided with a tree structured codebook 212 which is identical to the tree structured codebook 114 of the encoder apparatus 100 of FIG. 7. The address on line 216 provided by the discriminator circuit 208 is employed by the codebook processor 210 to retrieve the identical codevector which was found to be the best match by the encoder 100 of FIG. 7 (or to retrieve the codevector at the copied address). This codevector, which represents a residual codevector, is supplied on a line 218, to the input of a summing circuit 216. The discriminator 208 supplies the mean value to another input of the summer 216 via line 220. (In the event of a copy previous vector instruction, the mean value associated with the previous vector is retrieved from the buffer 206). The summer adds the mean value to the residual codevector to supply, on line 222, a reproduced codevector which is a substantial representation, in the form of a digital value, of the corresponding input vector processed by the encoder 100 of FIG. 7. Each digital value is then converted to analog form and NTSC encoded and supplied to the input of a TV or VCR as hereinbefore described.

Figure 12:
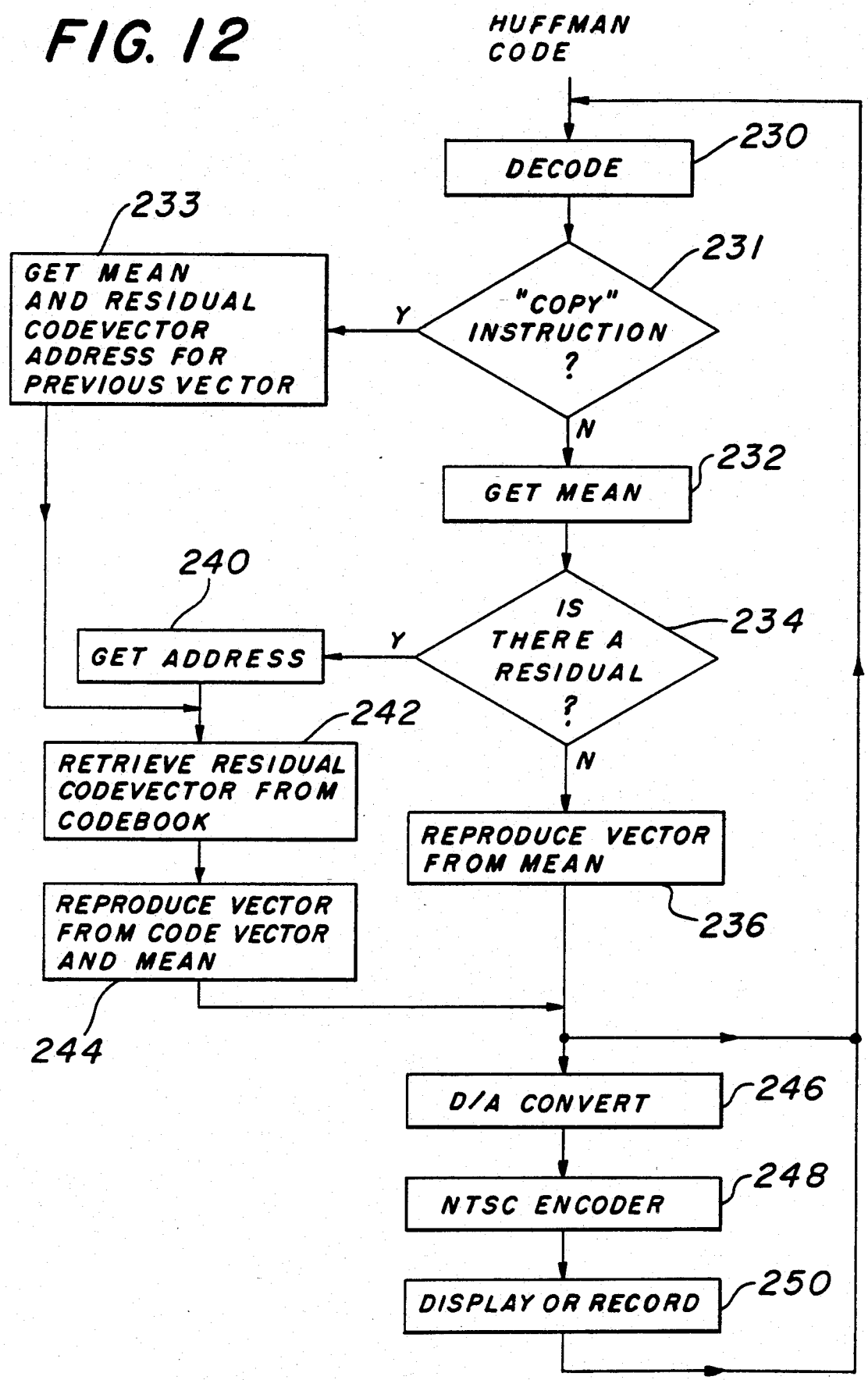
FIG. 12 is a flowchart illustrating the operation of the apparatus of FIG. 11.

FIG. 12 is a flowchart illustrating the operation of the circuit of FIG. 11. As shown, each received Huffman code is decoded by circuit 204, as shown at step 230. A determination is made at step 231 whether a "copy previous vector" instruction is present. If so, the mean value, and if applicable, the address of the previous codevector (which is a residual codevector) are retrieved from the buffer 206, as shown at step 233. However, if no instruction is present, then there is vector quantized data which must be decoded. Thus, the mean value is retrieved from the received data, step 232, then, at step 234, a determination is made as to whether the codebook address of a corresponding residual vector was transmitted with this mean value. As previously mentioned, this may be determined by appending a code to the mean value at the encoder when its transmission is not accompanied by a codebook address (the Huffman encoder will do this automatically). If, at step 234, it was determined that a codebook address did not accompany this mean value, then, as shown at step 236, the vector is reproduced solely from the mean value.

If, at step 234, it was determined that a codebook address did accompany the transmission of the mean value, then that codebook address is retrieved as shown at step 240. Then, as shown at step 242, the residual codevector residing at this address in the codebook 212 of the decoder 200 is retrieved. As shown at 244, a vector is reproduced by adding the mean value back to the residual codevector. When an image block has been received, its digital values are converted to analog form (step 246) and NTSC encoded at step 248. Thereafter, the NTSC image data may be displayed on a TV, or recorded on a VCR, as desired. Steps 240 et seq. are also performed after step 233 has been performed for a copy previous vector instruction, as shown.

Figure 16:
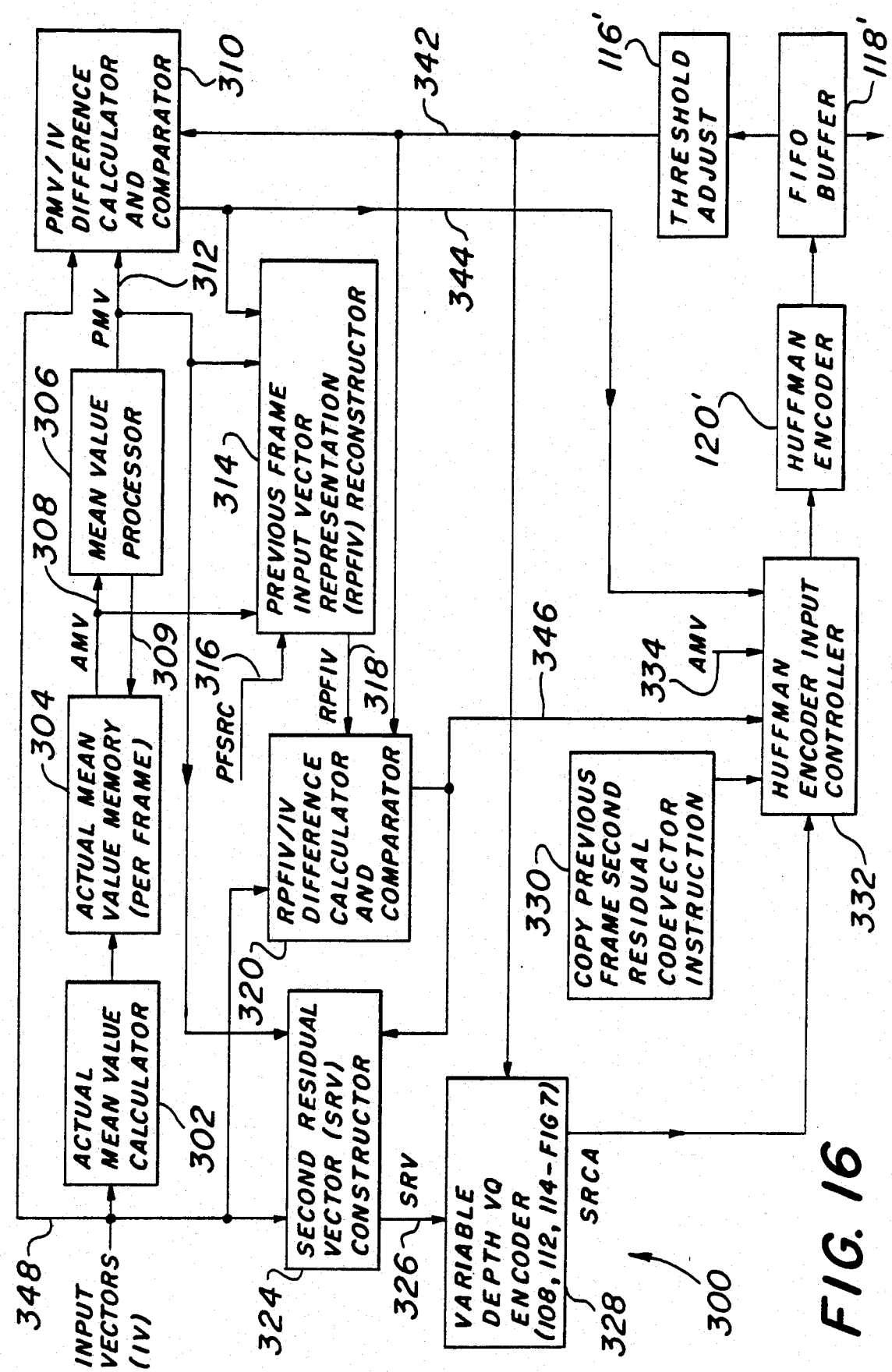
FIG. 16 is a block diagram illustrating an encoder apparatus for carrying out the vector quantization compression method according to the most preferred embodiment of the present invention.
Figure 17A:
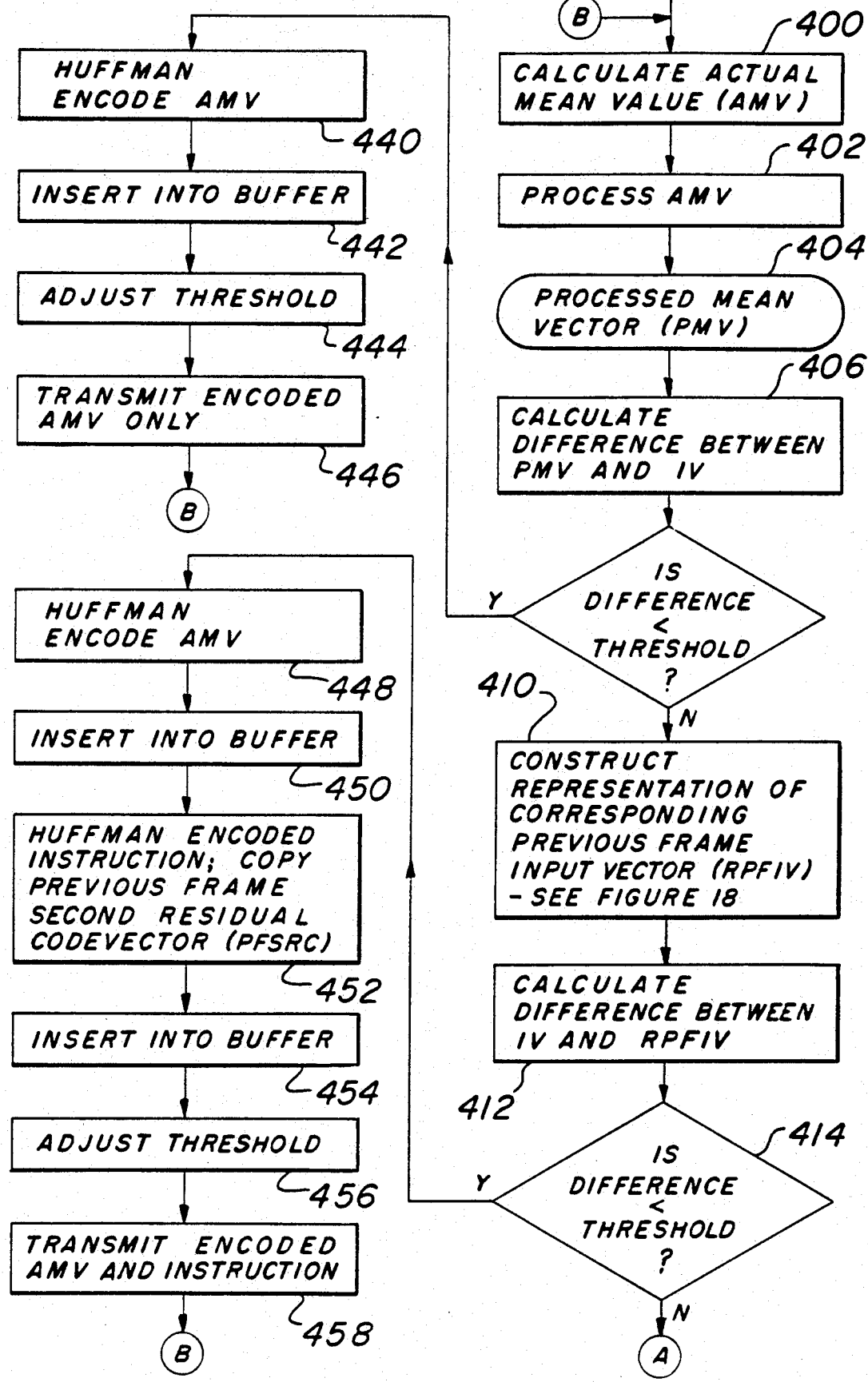
FIGS. 17A and 17B are a flowchart illustrating both the operation of the apparatus of FIG. 16 and the preferred embodiment for carrying out the vector quantization compression method of the present invention.
Figure 17B:
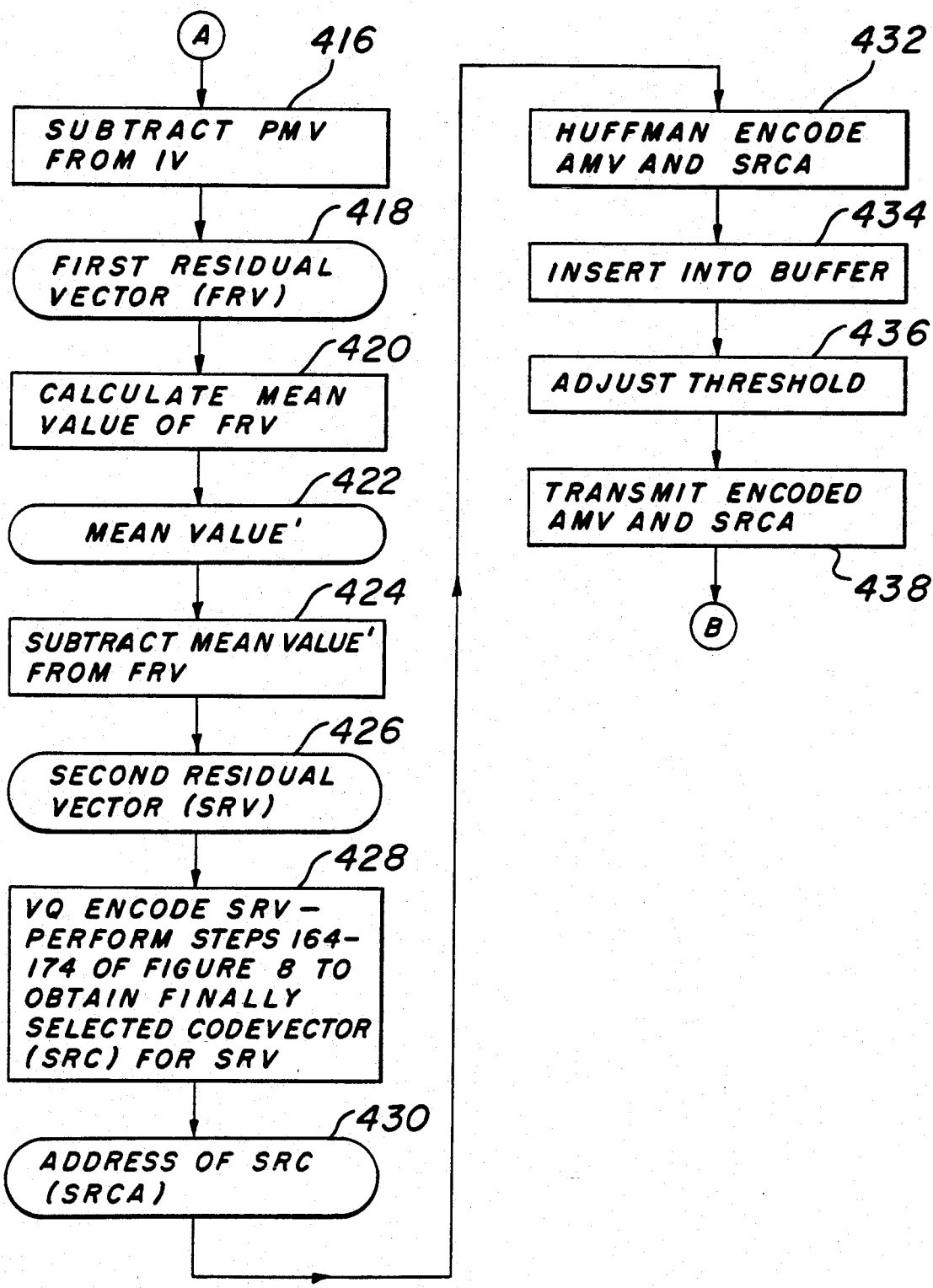
Figure 18:
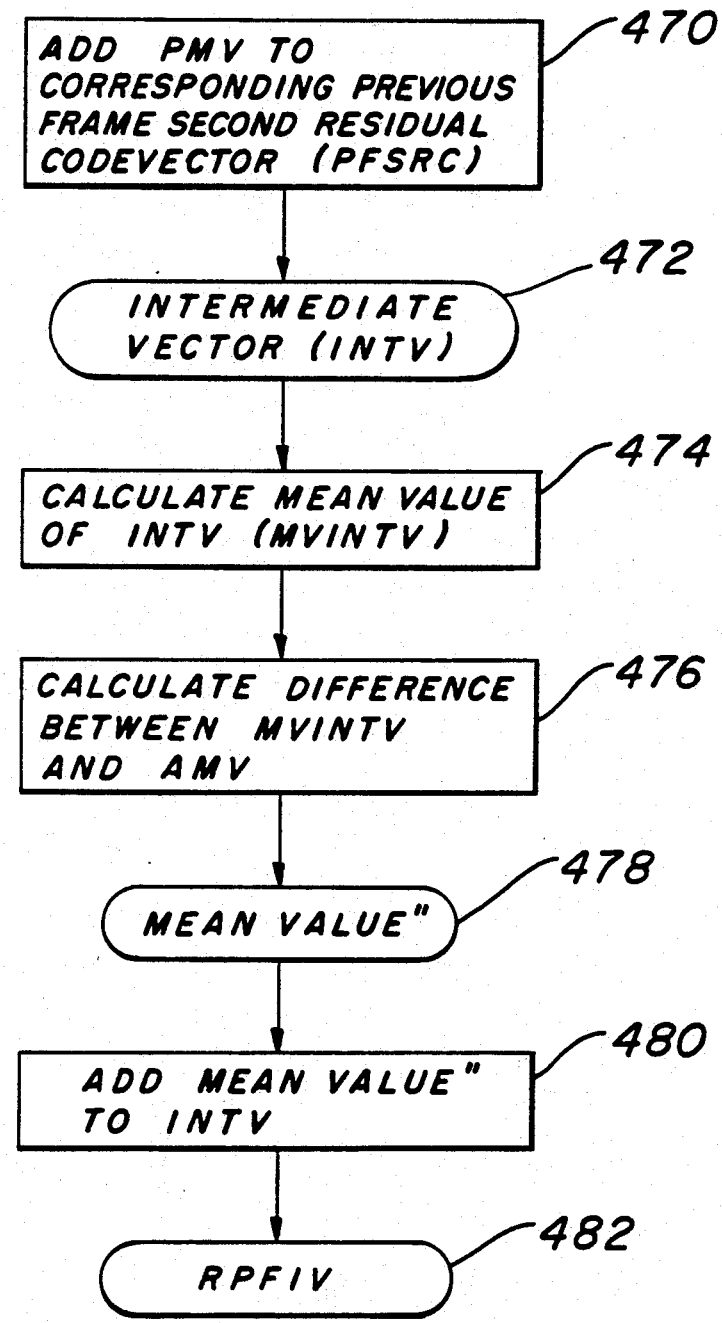
FIG. 18 is a flowchart illustrating details of block 410 of FIG. 17A.
Figure 19:
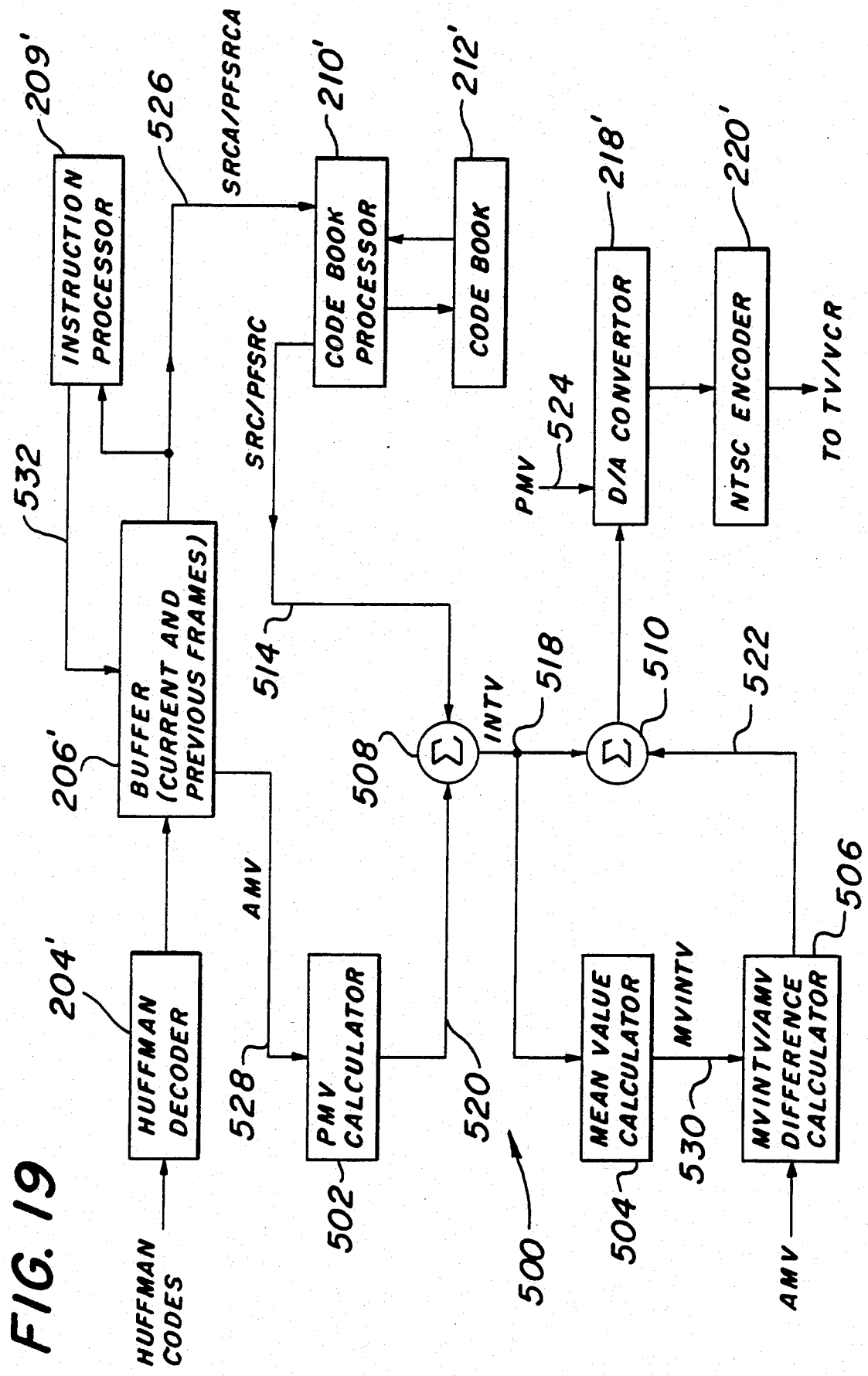
FIG. 19 is a block diagram of a decoder apparatus for carrying out vector quantization decompression according to the most preferred embodiment of the present invention.
Figure 20:
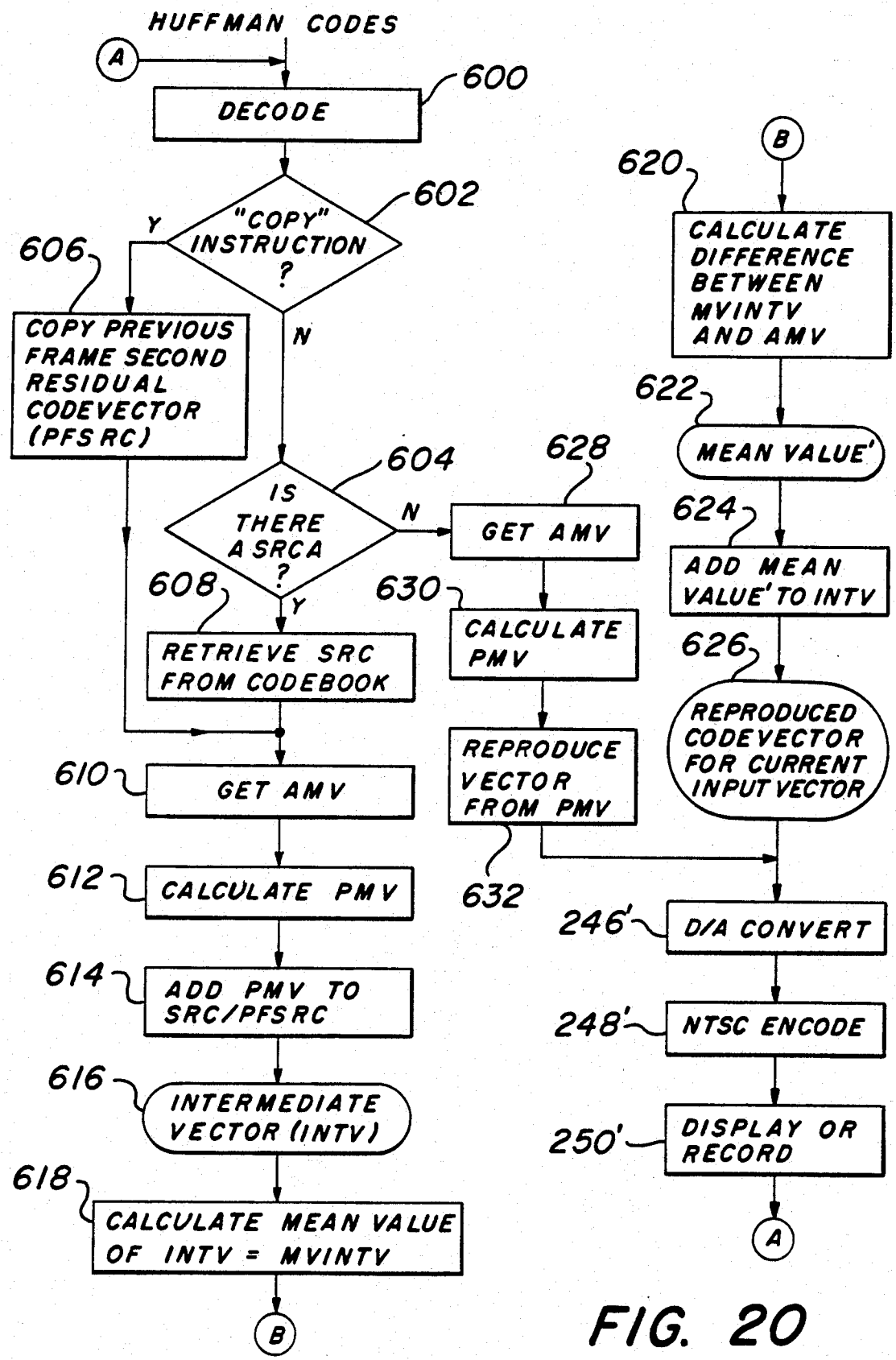
FIG. 20 is a flowchart illustrating the operation of the decoder of FIG. 19.

FIGS. 16-20 illustrate an encoding and decoding method and apparatus according to a most preferred embodiment of the present invention. In particular, FIG. 16 illustrates a block diagram of a preferred encoder, and FIGS. 17A-17B and 18 illustrate the operation thereof. FIG. 19 is a block diagram illustrating a decoder for use with the encoder of FIG. 16, and FIG. 20 is a flowchart illustrating the operation thereof. The apparatus of FIG. 16 may be employed to implement blocks 22 and 48 of FIGS. 1 and 2 and the apparatus of FIG. 19 may be employed to implement blocks 28, 38 and 52 of FIGS. 1 and 2.

In the encoder of FIG. 16, the operation of the variable depth distortion adaptive VQ algorithm is the same as described above, except that "second residual codevectors" are stored in the codebook of the encoder of FIG. 16, whereas the codebook of the encoder of FIG. 7 stores "first residual codevectors". A first residual codevector is one that corresponds to an input vector with a mean value once removed. A second residual codevector is that corresponds to an input vector with mean values twice removed. The manner in which second residual codevectors are generated is discussed below.

A principal difference between the operation of the encoder of FIG. 16 and the encoder of FIG. 7 is the manner in which redundant, or similar, vectors in current and previous frames are processed. Another difference is that, in the encoder of FIG. 16, mean values for an entire frame are computed and stored in the encoder before vector quantization for each of the vectors in that frame is performed. The reason for preprocessing the vectors and storing their mean values is explained below.

Turning now to FIG. 16, there is illustrated therein a preferred encoder labeled generally 300. The encoder comprises an actual mean value calculator 302 which computes the actual mean value (AMV) of the input vectors (IV) of each frame. The AMV's are scalar quantities. All of the AMV's for each frame are stored in a memory 304. Thus, AMV's for each frame are computed and stored in the memory 304 before any further processing takes place.

A mean value processor 306 selects, via lines 308, 309, the AMV for a current IV under consideration, and computes therefor a processed mean vector, PMV, which is supplied on an output 312 of the processor 306. The PMV for each input vector IV is a vector quantity that is interpolated from the AMV's for both the current IV, as well as from all IV's that surround the current IV. The function of the processor 306 is to provide a PMV for the current IV which, when combined with the PMV for surrounding IV's, reduces or eliminates "blocking" at or near the edges of adjoining vectors. Essentially, this is achieved by interpolating, from the AMV's for the current and surrounding IV's, values for the individual PMV vector elements that will not result in drastic magnitude changes at vector boundaries. Values for the individual PMV vector elements near the center of each vector are similarly interpolated from these AMV's and are chosen so that the average value of the vector elements in each PMV is the same or similar to the AMV for the current IV. Such interpolation techniques are well known in the art. One such interpolation technique is summarized in Shen, Hsiaouhui and Baker, Richard L., "A Finite State/Frame Difference Interpolative Vector Quantizer For Low Rate Image Sequence Coding", *IEEE Int. Conf. Acoust., Speech, Signal Processing*, vol. 2, pp. 1188-1191, April 1988. See also Hang, H. and Haskell, B., "Interpolative Vector Quantization of Color Images". Both of these references are incorporated herein by reference. Co-pending patent application Ser. No. 794,487 entitled Apparatus for "Method Low Frequency Removal in Vector Quantization" also describes an interpolation technique that may be employed to reduce blocking artifacts.

The PMV from the processor 306 and the current IV are both supplied to a PMV/IV difference calculator and comparator 310 via lines 312, 348, respectively. The calculator/comparator 310 computes the difference between the PMV and IV and compares the difference to a threshold that is provided on line 342 from threshold adjust circuit 116'. The result of this comparison is provided to a previous frame input vector representation reconstructor (RPFIV) 314, as well as to a Huffman encoder input controller 332 via line 344. The reconstructor 314 also receives as inputs the PMV and AMV from the current IV, and further receives as an input, on line 316, the logically corresponding previous frame second residual codevector (PFSRC), i.e., from the previous frame. The RPFIV generated by reconstructor 314 is supplied to a RPFIV/IV difference calculator and comparator 320 via line 318. The calculator/comparator 320, which also receives as inputs the IV and the threshold, calculates the difference between the RPFIV and IV and compares the result to the threshold. The result is supplied via line 346 to the Huffman encoder input controller 332 and to a second residual vector (SRV) constructor 324. The reconstructor 324 also receives as input the IV and the PMV. The nature and purpose of the SRV will become evident hereinafter. The SRV is supplied via line 326 to a variable depth VQ encoder 328. The variable depth VQ encoder 328 has been shown as a single block 328 for purposes of simplicity. The block 328 corresponds to blocks 108, 112 and 114 of FIG. 7, and operates in accordance with blocks 164-174 of the flowchart of FIG. 8B, except that the codebook 114 stores second residual codevectors (SRC's) instead of first residual codevectors. The output of the variable depth VQ encoder 328 is a second residual codevector address (SRCA) which is supplied to an input of the Huffman encoder input controller 332, as shown.

The Huffman encoder input controller 332 also receives as inputs the AMV on a line 334 and the "copy previous frame second residual codevector" instruction 330. The function of the controller 332 is to select the correct one(s) of the various inputs and supply it (them) to the Huffman encoder 120' for Huffman encoding and subsequent insertion into the FIFO buffer 118'. The manner in which these inputs are selected will become evident from the flowcharts of FIG. 17A and 17B.

The threshold adjust circuit 116', the FIFO buffer 118' and the Huffman encoder 120' all operate in accordance with the principles previously discussed above.

Referring now to the flowcharts of FIG. 17A and 17B, the operation of the encoder of FIG. 16 will be described. As shown at step 400, the AMV's for all IV's for the current frame are calculated and stored in the memory 304. Thereafter, the IV, and the AMV for each IV, are processed in order as shown in the flowcharts. As shown at step 402, the AMV for a current IV is processed, as before described, to yield the PMV for the current IV as shown at 404. At step 406, the difference between the PMV and IV is calculated, and this difference is compared to the threshold, as shown at step 408. If the difference fails to exceed the threshold, then the controller 332 selects only the AMV and only this AMV is Huffman encoded, step 440. Then, the Huffman encoded AMV is inserted into the buffer 118', step 442, the threshold is adjusted, step 444, and the AMV for this IV is transmitted, step 446.

If, at step 408, it was found that the difference exceeds the threshold, then steps 410 et seq. are performed. At step 410 the representation of the previous frame input vector (RPFIV) that logically corresponds to the current IV is constructed. The manner in which the RPFIV is constructed is detailed in FIG. 18 and is described below. At step 412, the difference between the current IV and the RPFIV is calculated. At step 414, this difference is compared to the threshold. If the difference fails to exceed the threshold, then the AMV for the current IV is Huffman encoded (via controller 332), step 448, and the Huffman encoded AMV is inserted into the buffer 118', step 450. Also, the copy previous frame second residual codevector instruction 330 is selected by the controller 332 and inserted into the buffer as shown at steps 452 and 454. Thereafter, the threshold is adjusted and the data is transmitted as shown at steps 456, 458.

If, at steps 414, it was determined that the difference exceeded the threshold, then steps 416 et seq. are performed. At step 416, the PMV (corresponding to the current IV) is subtracted from the current IV to yield a first residual vector (FRV), as shown at 418. Then, the mean value (a scalar quantity, not a vector quantity) of the FRV is calculated, as shown at step 420. The result defines a mean value', as shown at step 422. At step 422, the mean value' is subtracted from FRV to yield a second residual vector (SRV). As shown at step 428, the SRV is vector quantized according to the algorithm discussed above in connection with steps 164–174 of FIG. 8B. As a result of vector quantizing the SRV, a finally selected codevector (SRC) is obtained for the SRV. The result of the vector quantization process is a second residual codevector address (SRCA), as shown at step 430.

As shown at step 432, the AMV and the SRCA for the current IV are Huffman encoded (via controller 332), then inserted into the buffer 118', as shown at step 434. Thereafter, the threshold is adjusted, step 436, and the data transmitted, step 438.

Turning now to FIG. 18, the manner in which step 410—constructing a representation of the logically corresponding previous frame second residual codevector (RPFIV)—is carried out will be explained. As shown at step 470, the second residual codevector that was selected for the logically corresponding vector of the previous frame (PFSRC) is retrieved and added to the PMV for the current IV. (A buffer or memory, not shown, may be provided for storing all of the PFSRC's of the immediately preceding frame.) The result of step 470 is an intermediate vector (INTV), as shown at step 472. At step 474, the mean value (a scalar quantity, not a vector quantity) of the INTV is calculated. This mean value is referred to in the flowcharts as MVINTV. At step 476, the difference between the just calculated MNINTV and the AMV for the current IV is calculated; this difference defines a mean value'', as shown at step 478. At step 480, the mean value'' is added to the INTV to yield the RPFIV (i.e., the reproduced previous frame input vector), as shown at step 482.

Thus, according to the method of FIGS. 17A and 17B, the actual mean value AMV for each input vector IV is always transmitted, even if a "copy previous frame second residual codevector" instruction is transmitted. This is so because all AMV's for the current frame are needed to calculate the PMV for each vector in the current frame, and the PMV's are needed to construct the representations of the corresponding previous frame input vectors (RPFIV's). It will also be seen that when vector quantization is carried out, it is upon a second residual vector (SRV) that is twice removed from its corresponding input vector IV. It has been found that vector quantization of the SRV, rather than vector quantization of the first residual vector FRV (which is the residual vector employed in connection with the method of FIG. 8) provides better compression and yields better reproduction results at the decoder.

Turning now to FIG. 19, the decoder 500 for decoding VQ data transmitted by the encoder 300 of FIG. 16 will be described. As shown, the decoder 500 comprises a Huffman decoder 204' for receiving incoming Huffman data. The decoded data is stored in a buffer 206' which, for reasons which will become evident hereinafter, stores two full frames of mean (AMV) and address (SRCA) data, as well as copy previous frame second residual codevector instructions. These two full frames of data are necessary to reconstruct the PMV's for each IV. Thus, the decoder 500 must receive all data for the current frame (and must have the data for the previous frame in the buffer 206') before it may begin processing and decoding the current frame. Once a full frame of data for the current frame has been received, the data associated with each input vector IV thereof may be processed in turn.

The codebook processor 210' retrieves the SRCA for a current IV under consideration. For each received SRCA, the codebook processor 210, retrieves the corresponding SRC from the codebook 212' and provides it to a summing circuit 508 via line 514. The instruction processor 209' monitors for the occurrence of copy previous frame second residual codevector instructions. When such an instruction is encountered, the processor 209' retrieves the address of that previous frame second residual codevector (PFSRCA) from the buffer 206' and supplies it over line 526 to the codebook processor 210'. The codebook processor then retrieves the corresponding previous frame second residual codevector (PFSRC) from the codebook 212' and supplies it the summing circuit 508' via line 514. Thus, SRCA and PFSRCA data provided on line 526 are treated identically by the codebook processor 210' although only one or the other will be present at any time. The summing circuit 508 also treats the SRC and PFSRC data on line 514 identically, although only one or the other will be present at any time.

A PMV calculator 502 receives, on the line 528, the AMV for the current IV under consideration, as well as all the AMV for all surrounding IV's. The calculator 502 reconstructs the PMV for the current IV employing this data and supplies the result on line 520 to the summing circuit 508. The summing circuit 508 sums the PMV on line 520 to either the SRC or PFSRC data on line 514 to provide, on line 518, an intermediate vector (INTV). The INTV on line 528 corresponds to the INTV of block 472 of FIG. 18. The INTV is supplied to both a summing circuit 510 and a mean value calculator 504. Calculator 504 calculates the mean value (a scalar quantity) of the INTV and supplies the result (MVINTV) to a MVINTV/AMV difference calculator 506. The calculator 506 calculates the difference between the just calculated MVINTV and the AMV for the current IV. The difference, which is a representation of the mean value' calculated at step 422 of FIG. 17B, is supplied to the summing circuit 510 via line 522. The summing circuit 510 adds the INTV to the mean value'. The result of this summation is a reproduced codevector which is a substantial representation of the current input vector IV. The result is supplied to a D/A converter 210', and the resulting analog data is supplied to an NTSC encoder 220' which places the same in a format suitable for display on a television or for recording on a VCR.

The D/A converter 218, also receives, on a line 524, the PMV for the current IV for reasons which will become evident from FIG. 20.

Referring now to FIG. 20, the operation of the decoder 500 of FIG. 19 will be explained in greater detail. As shown in step 600, the incoming Huffman codes are decoded via decoder 204' and the decoded data is stored in a buffer 206'. After all data for a current frame has been stored, it is processed in accordance with steps 602 et seq. As mentioned, data for each corresponding input vector IV is processed in turn.

At step 602, the occurrence of "copy previous frame second residual codevector" instructions is monitored. If such an instruction is encountered, then the PFSRCA is retrieved from the buffer 206 and the corresponding PFSRC is retrieved from the codebook 212', as shown at step 606. Thereafter, processing resumes at step 610. However, if no such instruction is encountered, then it must be determined whether only an AMV, or both AMV and SRCA are present for the current IV. If it is determined at step 604 that there is no SRCA for the current IV, then this is an indication that only the AMV was transmitted for this IV. Thus, at step 628, this AMV is retrieved from the buffer 206', and PMV is calculated as shown at step 630. The PMV is utilized as the reproduced version of the input vector IV, as shown at step 632.

If an SRCA was detected at step 608, then the corresponding SRC is retrieved from the codebook 212' as shown at step 608. Thereafter, the corresponding AMV is retrieved from the buffer 206' as shown at step 610, and the PMV is calculated, step 612. At step 614, the PMV is added to either the PFSRC or the SRC (whichever was provided to the summing circuit 508) to yield the intermediate vector INTV, step 616. At step 618, the mean value (a scalar quantity) of the INTV is calculated. In the flowchart of FIG. 20, this mean value is referred to as MVINTV.

At step 620, the difference between the just calculated MVINTV and the AMV for the current IV is calculated. As shown at 622, this difference defines a substantial reproduction of the mean value' calculated at step 422 of FIG. 17B. At step 624, the mean value' is added to the INTV to provide a reproduced codevector which is a substantial representation of the current input vector IV.

The D/A converter 218' converts either the PMV, from step 632, or the reproduced codevector, from step 626, to analog form, as shown at step 246'. The analog data is NTSC encoded, step 248', and then displayed or recorded as desired, step 250'.

In FIGS. 11, 12, 19 and 20, the reproduced image vector is shown as being supplied directly to the D/A converter 218, 218'. However, this illustration is simplified and is for purposes of expediency only. Those skilled in the art will readily appreciate that a full scan line will need to be obtained, i.e., from several sequential image vectors, for the NTSC encoder to trace a line of the image on the display or recording device. This may be performed by employing a small buffer to store those sequential image vectors needed to construct a scan line. An alternative method of retrieving a scan line is disclosed in co-pending patent application no. 794,487, entitled Apparatus for "Method Low Frequency Removal in Vector Quantization."

The invention has been described above as being carried out in the spatial domain, i.e., the codevectors stored in the codebook are representative of the spatial placement of the pixels in each sub-image, and the input vectors used to search the codebook are representative of the spatial placement of an actual group of pixels. However, the invention is not limited to implementation in the spatial domain. The invention may also be carried out in the transform, or frequency, domain wherein, instead of storing spatial codevectors as above described, their transforms are calculated and transformed codevectors are stored in the codebook. For example, each codevector would be replaced by its cosine (Fourier) transform, and each input vector would be transformed prior to searching the codebook. In this case, the codebook would still be constructed as described in the above mentioned Linde et al. reference, but entries would be based upon a distance metric (e.g., mean square error) in the transformed vector space. Thus, in the encoder, the tree search would be carried out in the transform domain. However, the decoder could remain unchanged. The decoder codebook would continue to operate in the spatial domain. The advantage of this approach is that it is believed that it would result in fewer "block" artifacts commonly found in VQ encoder/decoder schemes.

The present invention may be employed in other specific forms without departing from the spirit or essential attributes thereof and, accordingly, reference should be made to the appended claims rather than to the foregoing specification, as indicating the scope of the invention.

We claim:

1. In a Vector quantization encoder of the type that employs a tree structured codebook to vector quantize input vectors and sequentially transmits vector quantized data for input vectors to a remote decoder for reconstructing a substantial representation of each input vector therefrom, the codebook having plural levels of codevectors, each codevector being representative of a possible input vector and there being an identification (ID) code associated with each codevector, the codevectors at each successive level representing possible input vectors with greater accuracy than codevectors at a preceding level, a method comprising the steps of:

a) comparing a representation of a previous input vector that has already been vector quantized to a current input vector to obtain a first measure of difference between the representation of the previous input vector and the current input vector;

b) transmitting to the decoder an instruction to reconstruct a substantial representation of the current input vector from vector quantized data already stored in the decoder for the previous input vector only when the first measure of difference is less than a threshold value, but otherwise performing the following steps for the current input vector;

c) processing the current input vector and selecting an initial level of the codebook;

d) comparing the processed input vector to the codevectors at the selected level of the codebook and selecting the codevector that most closely resembles the processed input vector;

e) obtaining a second measure of difference between the processed input vector and the selected codevector;

f) transmitting an indication of the ID code associated with the selected codevector only if the second measure of difference is less than the threshold value, but otherwise selecting a next level of the codebook and repeating steps (d) and (e) until either the second measure of difference is less than the threshold value or a last level of the codebook has been employed, then transmitting the indication of the ID code associated with the finally selected codevector, the transmitted indication being the vector quantized data for the current input vector;

wherein vector quantized data for the current input vector need not be transmitted to reconstruct a representation of the current input vector at the decoder when the first measure of difference is less than the threshold value.

2. Method according to claim 1 wherein the representation of the previous input vector is a copy of the previous input vector.

3. Method according to claim 1 wherein the representation of the previous input vector is constructed from a codevector finally selected from the codebook for the previous input vector and from a mean vector quantity.

4. Method according to claim 1 wherein step (c) comprises determining a mean of the current input vector and removing the mean from the current input vector to obtain a residual vector, the processed input vector comprising the residual vector.

5. Method according to claim 4 wherein step (b) further comprises transmitting the mean with the instruction and step (f) further comprises transmitting the mean with the indication.

6. Method according to claim 1 wherein a mean value of each input vector is determined and a mean vector for the current input vector is interpolated from the mean value of the current input vector and any adjacent vectors and wherein step (c) comprises subtracting the mean vector from the current input vector.

7. Method according to claim 6 wherein the result of the subtraction defines a first residual vector and step (c) further comprises calculating a mean value of the first residual vector and subtracting the mean value of the first residual vector from the first residual vector to define a second residual vector, the processed input vector comprising the second residual vector.

8. Method according to claim 7 wherein the codevectors in the codebook are representative of possible second residual vectors.

9. Method according to claim 1 wherein the codebook is stored in a memory and each ID code is a memory address, and a compression code is assigned to each possible address, each compression code having a length that is substantially inversely proportional to a predetermined probability that a particular codevector will be finally selected, the transmitted indication comprising the compression code for the address associated with the finally selected codevector.

10. Method according to claim 9 wherein the compression codes are Huffman codes.

11. Method according to claim 10 wherein the instruction is a Huffman encoded instruction.

12. Method according to claim 1 wherein the transmitted indications have variable length, further comprising the step of automatically adjusting the threshold based upon a measure of average length of previously transmitted indications and instructions.

13. Method according to claim 9 wherein the indications and instructions are transmitted at a fixed data rate, further comprising the steps of storing indications and instructions to be transmitted in a buffer, periodically obtaining a measure of unused capacity of the buffer, and automatically adjusting the threshold value based upon the measure of unused buffer capacity.

14. Method according to claim 1 further comprising the step of determining a mean value for each input vector and wherein the following steps (i) and (ii) are performed prior to performing steps (c)-(f)

i) obtaining a third measure of difference between the mean value and the current input vector; and, ii) comparing the third measure of difference to the threshold value;

and wherein steps (c)-(f) are performed for the current input vector only if the third measure of difference is greater than the threshold value;

and further comprising the step of transmitting an indication of only the mean value of the current input vector when the third measure of difference is less than the threshold value.

15. Method according to claim 1 further comprising the step of determining a mean value for each input vector and wherein the following steps (i) and (ii) are performed prior to performing steps (a)-(f):

i) interpolating a mean vector from the mean value of the current input vector and any adjacent vectors;

i) obtaining a third measure of difference between the mean vector and the current input vector; and, ii) comparing the third measure of difference to the threshold value;

and wherein steps (a)-(f) are performed for the current input vector only if the third measure of difference is greater than the threshold value;

and further comprising the step of transmitting an indication of only the mean value of the current input vector when the third measure of difference is less than the threshold value.

16. Method according to claim 3 wherein a mean value is calculated for each input vector and the mean vector quantity for the current input vector is interpolated from the mean values for the current input vector and any adjacent input vectors, and the representation of the previous input vector is constructed according to the following steps:

i) adding the mean vector quantity for the current input vector to the codevector finally selected from the codebook for the previous input vector;

ii) determining a mean value of the result of step (i);

iii) determining a difference between the mean value determined in step (ii) and the mean value calculated for the current input vector; and, iv) adding the result of step (iii) to the result of step (i).

17. Method according to claim 1 wherein the input vectors are derived from portions of image frames representing moving images to be displayed on a television set, each image frame comprising a matrix of pixels and each pixel within each image frame having at least an associated intensity value, and at least ones of the input vectors are representative of the intensity values of a block of pixels in the image, the transmission of an instruction being an indication that the current input vector and the previous input vector represent portions of image frames that are substantially similar.

18. Method according to claim 1 wherein the input vectors are derived from portions of image frames representing moving images to be displayed on a television set, each image frame comprising a matrix of pixels and each pixel within each image frame having at least associated luminance and chrominance values, and at least ones of the input vectors are representative of the luminance and chrominance values of a block of pixels in the image, the transmission of an instruction being an indication that the current input vector and the previous input vector represent portions of image frames that are substantially similar.

19. Method according to claim 1 wherein the decoder is in a locale of a television setand the decoder has another substantially identical tree structured codebook, and wherein the following steps are performed at the decoder:

(i) receiving an indication transmitted in step (f), obtaining the ID code therefrom, and retrieving from the codebook at the decoder the codevector associated with the obtained ID code to provide a substantial representation of the input vector that resulted in the transmission of the indication;

(ii) receiving an instruction transmitted in step (b) and, in response thereto, retrieving from the codebook at the decoder a codevector, defining a previous codevector, having the same ID code as a previously received ID code, and reproducing from the previous codevector a substantial representation of the input vector that caused the transmission of the instruction;

(iii) employing the reproduced representations of the input vectors to substantially re-create each image frame at the locale of the television set.

20. Method according to claim 19 wherein step (ii) further comprises adding a mean value to the previous codevector.

21. Method according to claim 8 wherein the decoder is in a locale of a television set, the decoder has a codebook that is substantially identical to the codebook at the encoder, and wherein the following steps are performed at the decoder:

i) for indications that are received at the decoder, obtaining the ID code from the received indications, retrieving from the codebook at the decoder the second residual codevector associated with the obtained ID code, and reproducing from the retrieved second residual codevector a substantial representation of the input vector that caused the transmission of the indication;

ii) for instructions that are received at the decoder, obtaining from a buffer in the decoder the same ID code as a previously received ID code, retrieving from the codebook at the decoder the second residual codevector associated with the previously received ID code, and reproducing from the retrieved second residual codevector a substantial representation of the input vector that caused the transmission of the instruction;

iii) employing the reproduced representations of the input vectors to substantially re-create each image frame at the locale of the television set.

22. Method according to claim 21 wherein the mean value of each input vector is transmitted to the decoder and steps (i) and (ii) each comprise:

i') for a current input vector whose substantial representation is to be reproduced, interpolating from the mean value of the current input vector and any adjacent input vectors a substantial reproduction of the mean vector;

ii') adding the mean vector reproduced in step (i') to the second residual codevector retrieved at the decoder;

iii') calculating the mean value of the result of step (ii');

iv') calculating a difference between the mean value calculated in step (iii') and the mean value received at the decoder for the current input vector;

v') adding the result of step (iv') to the result of step (ii');

the result of step (v') being the substantial representation of the input vector.

23. Method according to claim 19 or 21 wherein the indications and instructions are transmitted via satellite to a reception site then retransmitted at the reception site over a cable television distribution network to a plurality of cable television subscribers.

24. Method according to claim 19 or 21 wherein the indications and instructions are transmitted via satellite directly to a pay television subscriber.

25. Method according to claim 1 wherein the decoder is in a locale of a reception site and the indications and instructions are transmitted via satellite to the reception site and the following steps are performed at the reception site:

providing at the decoder a codebook that is substantially identical to the codebook at the encoder;

receiving an indication transmitted in step (f), obtaining the ID code therefrom, and retrieving from the codebook at the decoder the codevector associated with the obtained ID code to provide a substantial representation of the input vector that resulted in the transmission of the indication;

receiving an instruction transmitted in step (b) and, in response thereto, retrieving from the codebook at the decoder a codevector, defining a previous codevector, having the same ID code as a previously received ID code, and reproducing from the previous codevector a substantial representation of the input vector that caused the transmission of the instruction;

employing the reproduced representations of the input vectors to substantially re-create each image frame at the reception site and encoding data for each re-created image frame in NTSC format;

transmitting the NTSC encoded data from the reception site to a plurality of cable television subscribers over a cable television distribution network.

26. Method according to claim 17 or 18 wherein the indications are transmitted at a substantially fixed rate, further comprising the step of selecting a value for the threshold that causes a predetermined number of image frames to produce just a sufficient number of indications to yield the fixed rate over the predetermined number of frames.

27. In a vector quantization encoder of the type employing a tree structured codebook having plural levels of codevectors representative of possible input vectors to be processed by the encoder, each input vector being indicative of a block of data, the codebook being stored in a memory and each codevector having an associated memory address, and wherein the encoder transmits vector quantized data for input vectors to a remote decoder and the decoder reconstructs substantial representations of each input vector from the transmitted vector quantized data, a method comprising the steps of:

a) providing at the encoder an input vector to be processed;
b) determining a mean of the input vector and transmitting data indicative of the mean to the decoder;
c) obtaining a first measure of difference between the input vector and the mean, and comparing the first measure of difference to a threshold value;
d) performing steps (i) and (ii) below only when the first measure of difference exceeds the threshold value, but otherwise proceeding to step (e):
  (i) selecting a codevector from the codebook based upon a processed version of the input vector and the threshold value; and,
  (ii) transmitting to the decoder data indicative of the address associated with the selected codevector;
the data transmitted in step (b) and, when performed, step (d)(ii), being the vector quantized data, the decoder reconstructing a representation of the input vector from the transmitted vector quantized data,
e) providing at the encoder another input vector and obtaining a second measure of difference between said another input vector and at least a representation of the input vector provided in step (a), the input vector provided in step (a) defining a previous vector;
f) transmitting to the decoder at least an instruction to employ the vector quantized data transmitted for the previous vector to reconstruct a substantial representation of the said another input vector only if the second measure of difference is less than the threshold value, but otherwise performing steps (b) through (d) for said another input vector.

28. Method according to claim 27 wherein a scalar mean value is calculated for each input vector and the mean transmitted in step (b) is the scalar mean value, and prior to performing step (c), a mean vector is interpolated from the scalar mean value for the input vector of step (a) and from scalar mean values for adjacent input vectors, the mean employed in step (c) being the mean vector.

29. Method according to claim 27 wherein, prior to performing step (d)(i), the mean is removed from the input vector of step (a) to obtain a residual vector, the processed version of the input vector comprising the residual vector.

30. Method according to claim 28 wherein, prior to performing step (d)(i), the following steps are performed:

i') removing the mean vector from the input vector of step (a);
ii') determining a mean value of the result of step (i');
iii') subtracting the mean value determined in step (ii') from the result of step (i');
the result of step (iii,) being the processed version of the input vector of step (a).

31. Method according to claim 27 wherein step (f) comprises transmitting both the instruction and a mean of the said another input vector.

32. Method according to claim 27 wherein the representation of the input vector provided in step (a) is a copy of the input vector provided in step (a).

33. Method according to claim 27 wherein the mean determined in step (b) is a scalar quantity and the representation of the input vector provided in step (a) is reconstructed from the codevector selected from the codebook in step (d) for input vector of step (a) and from a mean vector interpolated from the scalar mean quantity for the said another input vector.

34. Method according to claim 33 wherein the representation of the input vector provided in step (a) is reconstructed according to the following steps:
  i) adding the mean vector to the codevector selected in step (d);
  ii) determining a mean value of the result of step (i);
  (iii) determining a difference between the mean value determined in step (ii) and the scalar mean quantity for said another input vector; and,
  (iv) adding the result of step (iii) to the result of step (i).

35. Method according to claim 27 wherein a compression code is assigned to each possible address, each compression code having a length that is substantially inversely proportional to a predetermined probability that a particular codevector will be selected in step (d)(i), and step (d)(ii) comprises transmitting the compression code for the address associated with the selected codevector, and further wherein compression codes are assigned to the mean and to the instruction and step (b) comprises transmitting a compression code indicative of the mean and step (f) comprises transmitting a compression code indicative of the instruction.

36. Method according to claim 35 further comprising the step of periodically adjusting the threshold value based upon an average length of data transmitted in steps (b), (d)(ii) and (f).

37. Method according to claim 35 wherein the compression codes to be transmitted are temporarily stored then transmitted at a substantially fixed data rate.

38. Method according to claim 29 wherein step (d)(i) comprises:
  a') selecting an initial level of the codebook;
  b') selecting the codevector at the selected level that most closely resembles the residual vector;
  c') obtaining a third measure of difference between the selected codevector and the residual vector;
  d') proceeding to step (d)(ii) only if the third measure of difference is less than the threshold value, but otherwise selecting a next level of the codebook and repeating steps (b') and (c') until either the third measure of difference is less than the threshold value or a last level of the codebook has been employed, then proceeding to step (d)(ii).

39. Method according to claim 35 wherein the compression codes are Huffman codes.

40. A variable rate method for vector quantizing input vectors and transmitting vector quantized data to a remote decoder for reconstruction of substantial representations of each input vector comprising the steps of:

a) providing, in a memory, a tree structured codebook;
b) receiving data indicative of an image to be compressed, organizing the image data into blocks, and converting each block to a multi-dimensional input vector;
c) determining a scalar mean value of each input vector and interpolating, from the scalar mean values, a mean vector for each input vector;
d) selecting an input vector;
e) obtaining a first measure difference between the selected input vector and the mean vector for the selected input vector;
f) storing in a FIFO buffer only an indication of the scalar mean value of the selected input vector only if the first measure of difference is less than a threshold value then selecting another input vector and returning to step (e), but proceeding to step (g) if the first measure of difference is greater than the threshold;
g) constructing a representation of a previous input vector that has already been vector quantized and obtaining a second measure of difference between the selected input vector and the representation of the previous input vector;
h) storing in the FIFO buffer both an indication of the scalar mean value of the selected input vector and an instruction to the decoder to reproduce a substantial representation of the selected input vector from vector quantized data already stored in the decoder for the previous input vector only if the second measure of difference is less than the threshold then selecting another input vector and returning to step (e), but proceeding to step (i) if the second measure of difference is greater than the threshold;
i) constructing from the selected input vector a secondary vector having a mean at least once removed and defining a residual vector, there being stored in the codebook a plurality of codevectors at a plurality of levels, each codevector being representative of a possible residual vector and each successive level of codevectors representing possible residual vectors in greater detail than a preceding level of codevectors, there being a memory address associated with each codevector;
j) selecting an initial level in the codebook;
k) comparing the residual vector to the codevectors at the selected level and selecting the codevector that most closely resembles the residual vector;
l) obtaining a third measure of difference between the selected codevector and the residual vector, and comparing the third measure of difference to the threshold;
m) defining the selected codevector as a finally selected codevector and proceeding directly to step (o) if either the third measure of difference is less than the threshold or a last level of the codebook has been employed, but proceeding to step (n) if the third measure of difference exceeds the threshold;
n) selecting the next level in the codebook and repeating steps (k) through (m);
o) storing an indication of the address of the finally selected codevector in the FIFO buffer, selecting another input vector, and returning to step (e), at least the address indications having variable length;
p) transmitting the indications and instructions stored in the FIFO buffer to the decoder at a fixed data rate; and,
q) maintaining a measure of unused FIFO buffer capacity and periodically adjusting the threshold by automatically increasing the threshold value when the measure of unused FIFO buffer capacity indicates that unused capacity is decreasing and automatically decreasing the threshold value when the measure of unused FIFO buffer capacity indicates that unused capacity is increasing, adjustment of the threshold ensuring that the buffer does not empty or overflow as a result of storing variable length indications but transmitting the same at a fixed data rate, and wherein address indications are not stored in the FIFO buffer or transmitted to the decoder when the first or second measure of difference is less than the threshold.

41. Method according to claim 40 wherein at least the address indications are compression codes and each compression code has a length that is substantially inversely proportional to a predetermined likelihood that a particular codevector will be finally selected.

42. Method according to claim 41 wherein the compression codes are Huffman codes.

43. Method according to claim 40 wherein step (g) comprises:
   aa) adding the mean vector for the selected input vector to a codevector finally selected from the codebook for the previous vector;
   bb) determining a mean value of the result of step (aa);
   cc) determining a difference between the result of step (bb) and the scalar mean value for the selected input vector;
   dd) adding the result of step (cc) to the result of step (aa).

44. Method according to claim 43 wherein step (i) comprises:
   aa) subtracting from the selected input vector the mean vector for the selected input vector;
   bb) determining a mean value of the result of step (aa);
   cc) subtracting the mean value determined in step (bb) from the result of step (aa).

45. Data compression apparatus comprising:
   a) first means for receiving a multi-dimensional vector representative of a block of data to be compressed;
   b) a tree structured codebook having plural levels of codevectors, each codevector being representative of a possible vector and the codevectors at each successive level representing possible vectors in greater detail than codevectors at a preceding level, each codevector having a unique address associated therewith;
   c) a controller for selecting one of the codevectors in the codebook based upon the vector and a threshold value according to a distortion adaptive vector quantization technique;
   d) second means for transmitting data indicative of the address of the selected codevector; and,
   e) third means for obtaining a measure of difference between the vector received by the first means and a representation of a previous vector and for providing, based upon the measure of difference and the threshold value, an indication to a remote vector quantization decoder that the vector received by the first means is substantially similar to the previous vector and may be copied therefrom.

46. In a vector quantization encoder of the type employing a tree structured codebook having plural levels of codevectors representative of possible input vectors to be processed by the encoder, each input vector being indicative of a block of data, the codebook being stored in a memory and each codevector having an associated memory address, and wherein the encoder transmits vector quantized data for input vectors to a remote decoder and the decoder reconstructs substantial representations of each input vector from the transmitted vector quantized data, a method comprising the steps of:
- a) providing at the encoder an input vector to be processed;
- b) determining a mean of the input vector and transmitting data indicative of the mean to the decoder;
- c) obtaining a first measure of difference between the input vector and the mean, and comparing the first measure of difference to a threshold value;
- d) performing steps (i) and (ii) below only when the first measure of difference exceeds the threshold value, but otherwise proceeding to step (e):
  - (i) selecting a codevector from the codebook based upon a processed version of the input vector and the threshold value; and,
  - (ii) transmitting to the decoder data indicative of the address associated with the selected codevector;
- the data transmitted in step (b) and, when performed, step (d)(ii), being the vector quantized data, the decoder reconstructing a representation of the input vector from the transmitted vector quantized data,
- e) providing at the encoder another input vector, determining the mean of said other input vector and performing at least steps (c) and d(i) for said other input vector to obtain a codebook address for said other input vector;
- f) comparing the address for said other input vector to the address for the input vector provided in step (a) and transmitting to the decoder an instruction to substantially copy the input vector reconstructed from the vector quantized data transmitted in step (b) and, when performed, step (d)(i), to reconstruct a representation of said other input vector if the addresses are substantially identical but otherwise performing the following steps;
- g) obtaining a second measure of difference between said other input vector and the input vector provided in step (a);
- h) transmitting to the decoder an instruction to substantially copy the input vector reconstructed from the vector quantized data transmitted in step (b) and, when performed, step (d)(ii), to reconstruct a representation of said other input vector only if the second measure of difference is less than the threshold value, but otherwise transmitting the vector quantized data for said other input vector.

47. Data compression apparatus comprising:
- a) first means for receiving a multi-dimensional vector representative of a block of data to be compressed;
- b) a tree structured codebook having plural levels of codevectors, each codevector being representative of a possible vector and the codevectors at each successive level representing possible vectors in greater detail than codevectors at a preceding level, each codevector having a unique address associated therewith;
- c) a controller for selecting one of the codevectors in the codebook based upon the vector and a threshold value according to a distortion adaptive vector quantization technique;
- d) second means for transmitting data indicative of the address of the selected codevector; and,
- e) third means for comparing an address associated with a previous vector received by the first means to an address associated with a current vector received by the first means and, when the addresses are substantially identical, for providing an indication that the current vector is substantially similar to the previous vector and may be copied therefrom, but when the addresses are not substantially identical, for obtaining a measure of difference between the current vector and the previous vector and for providing, when the measure of difference is less than the threshold value, an indication that the current vector is substantially similar to the previous vector and may be copied therefrom.

48. Method according to claim 1, 27 or 40 wherein the codevectors are transformed to a transform domain before being provided in the codebook, and the codevectors are stored in the codebook in the transform domain, and wherein each input vector is transformed to the transform domain for selecting one of the codevectors from the codebook.

49. Method according to claim 48 wherein the transform domain is the frequency domain and the codevectors and input vectors are transformed to the frequency domain by a Fourier transform.

50. A decoder for use at a reception site of vector quantization data, wherein the vector quantization data originates from an encoding site employing a tree search vector quantization data compressor for compressing digital data indicative of at least intensity values of pixels of images to be transmitted to recipients by converting input vectors indicative of a block of pixels to addresses of a first codebook in the compressor, the first codebook having plural levels of codevectors representative of possible input vectors and each successive level representing codevectors with a greater accuracy than a preceding level of codevectors, the encoding site transmitting, for each input vector, data indicative of a mean of at least selected ones of the input vectors and one of either (i) data indicative of an address of the codevector found to most closely approximate each input vector or, (ii) an instruction to copy a representation of a previous input vector, the decoder comprising:
- a) a second codebook being substantially identical in content to the first codebook;
- b) a memory for storing at least the means and address data transmitted by the encoder for at least a current and a previous frame of image data;
- c) a controller for retrieving codevectors from the second codebook based upon the address data stored in the memory, the controller being responsive to each received instruction to employ address data for the previous frame stored in the memory to retrieve a codevector, defining a previous frame codevector, from the second codebook and to employ the previous frame codevector as a representation of an input vector in the current frame, but the controller, in selected instances, otherwise employing address data for the current frame to retrieve a codevector from the second codebook to obtain a representation of the input vector;

d) at least one converter for converting each codevector to NTSC format image data and for providing the NTSC format image data at an output thereof for substantially reproducing an image that was input to the encoding site.

51. Decoder according to claim 50 further comprising a summing circuit for adding each codevector retrieved from the second codebook to a corresponding one of the means stored in the memory.

52. Decoder according to claim 51 wherein a mean is transmitted from the encoding site for every input vector and stored in the memory of the decoder.

53. Decoder according to claim 50 wherein a mean is transmitted from the encoding site for every input vector and stored in the memory of the decoder, each transmitted mean being a scalar value, further comprising a mean vector calculator for providing a mean vector for a current input vector whose representation is to be obtained at the decoder, the mean vector being interpolated from the scalar mean value associated with the current input vector and the scalar mean value associated with any adjacent input vectors.

54. Decoder according to claim 53 further comprising:

a first summing circuit for adding each retrieved codevector to a corresponding one of the mean vectors;

a mean value calculator for computing a mean value of an output of the first summing circuit;

a difference calculator for calculating a difference between the mean value computed by the mean value calculator and the scalar mean value associated with the current input vector;

a second summing circuit for adding an output of the difference calculator to the output of the first summing circuit;

an output of the second summing circuit being the representation of the current input vector.

* * * * *